US012610636B2

(12) United States Patent
Gu et al.

(10) Patent No.: US 12,610,636 B2
(45) Date of Patent: Apr. 21, 2026

(54) PHOTOELECTRIC SENSOR AND SUBSTRATE

(71) Applicant: BOE TECHNOLOGY GROUP CO., LTD., Beijing (CN)

(72) Inventors: Pengfei Gu, Beijing (CN); Jie Huang, Beijing (CN); Feifei Li, Beijing (CN); Yuhang Lu, Beijing (CN); Rui Huang, Beijing (CN); Fengjuan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 18/034,094

(22) PCT Filed: Dec. 2, 2021

(86) PCT No.: PCT/CN2021/135035
§ 371 (c)(1),
(2) Date: Apr. 27, 2023

(87) PCT Pub. No.: WO2023/097598
PCT Pub. Date: Jun. 8, 2023

(65) Prior Publication Data
US 2025/0031465 A1      Jan. 23, 2025

(51) Int. Cl.
*H10F 39/00* (2025.01)

(52) U.S. Cl.
CPC ....... *H10F 39/8033* (2025.01); *H10F 39/016* (2025.01); *H10F 39/8037* (2025.01)

(58) Field of Classification Search
CPC .............. H10F 39/8033; H10F 39/016; H10F 39/8037; H10F 77/206; H10F 77/50; H10F 77/933; H10F 30/21
See application file for complete search history.

(56) References Cited

U.S. PATENT DOCUMENTS

| | | | |
|---|---|---|---|
| 6,046,446 A | 4/2000 | Kameshima et al. | |
| 10,741,606 B2 | 8/2020 | Sekine | |

(Continued)

FOREIGN PATENT DOCUMENTS

| | | |
|---|---|---|
| CN | 1187695 A | 7/1998 |
| CN | 104637962 A | 5/2015 |

(Continued)

OTHER PUBLICATIONS

T. K. Lin, S. J. Chang, Y.K. Su, B.R. Huang, M. Fujita, & Y. Horikoshi, "ZnO MSM photodetectors with Ru contact electrodes," Journal of Crystal Growth, 281 (2005) 513-517.

*Primary Examiner* — Shahbaz Nazrul

(74) *Attorney, Agent, or Firm* — Chiwin Law LLC

(57) ABSTRACT

A photoelectric sensor and a substrate are disclosed. The photoelectric sensor includes a photoelectric conversion layer, a first electrode and a second electrode, wherein the first electrode is arranged on a side of the photoelectric conversion layer, and the second electrode is arranged on a side of the photoelectric conversion layer and is spaced apart from the first electrode; wherein the first electrode and the second electrode are configured to drive the photoelectric conversion layer; and in a direction perpendicular to a surface of the photoelectric conversion layer, the first electrode and the second electrode are overlapped with the photoelectric conversion layer respectively, and the photoelectric conversion layer includes an oxide semiconductor material.

19 Claims, 17 Drawing Sheets

(56)　　　　　　References Cited

U.S. PATENT DOCUMENTS

| | | | |
|---|---|---|---|
| 2015/0123119 A1 | 5/2015 | Sekine et al. | |
| 2021/0083137 A1 | 3/2021 | Wang et al. | |
| 2021/0265428 A1* | 8/2021 | Saito ..................... | H10K 39/32 |
| 2021/0335867 A1* | 10/2021 | Yamada ............... | H10K 30/353 |
| 2023/0057648 A1* | 2/2023 | Okuda .................. | H10F 77/206 |

FOREIGN PATENT DOCUMENTS

| | | | |
|---|---|---|---|
| CN | 108807433 A | 11/2018 | |
| CN | 108897522 A | 12/2018 | |
| CN | 107017268 B | 12/2019 | |
| JP | H03234061 A | 10/1991 | |
| JP | 2015026703 A | 2/2015 | |

* cited by examiner

105A 105  101  103  102

101  103

105  101  103  105A 105   101A   103   102A   106

1023   1021   1022   1024

1018
1017
1016
1015
1014
1013
1012
1011

1025

102   103   101

1019

1012A

1012

1011

103   101

1019

1013
1012
1011

102   103   101                              1019

1023A   1021   1022   1023B 1015
1014
1013
1012
1011

102   103   101                              1019

1016B          1016C
      1021   1022

1016A 1016
1015
1014
1013
1012
1011

102   103   101                              1019

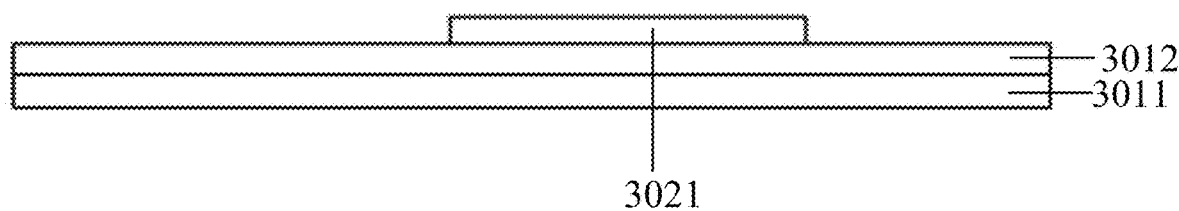
3012
3011
3021
FIG. 6B
3014A                    3014B
3014
3013
3012
3011
3021A     3022     3021 3021B
FIG. 6C
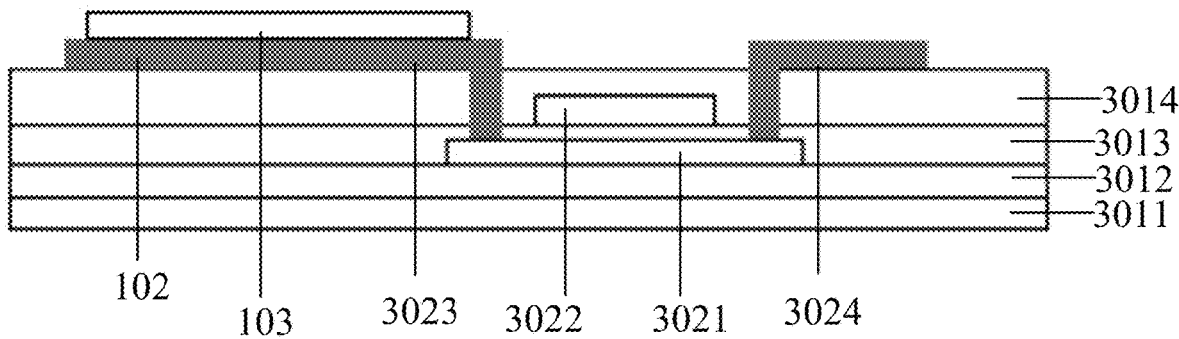
3014
3013
3012
3011
102
103     3023   3022    3021   3024
FIG. 6D 4020    103      4022
              4021

4014A 4014
4013

4012
4011

102 103    4023          4021
              4022    4024

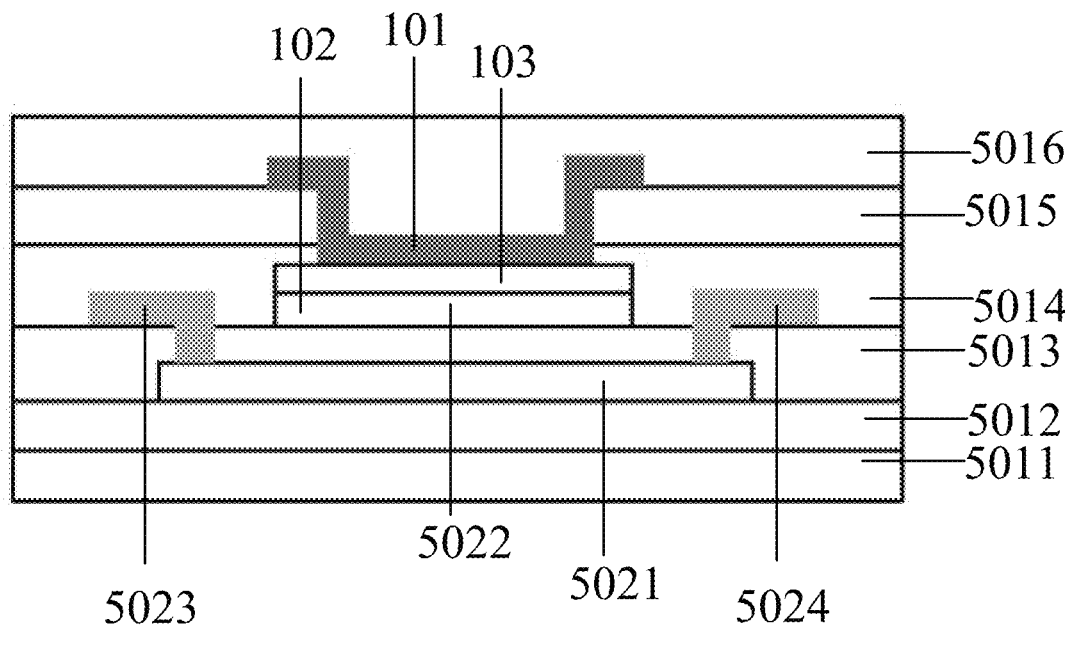
FIG. 8A
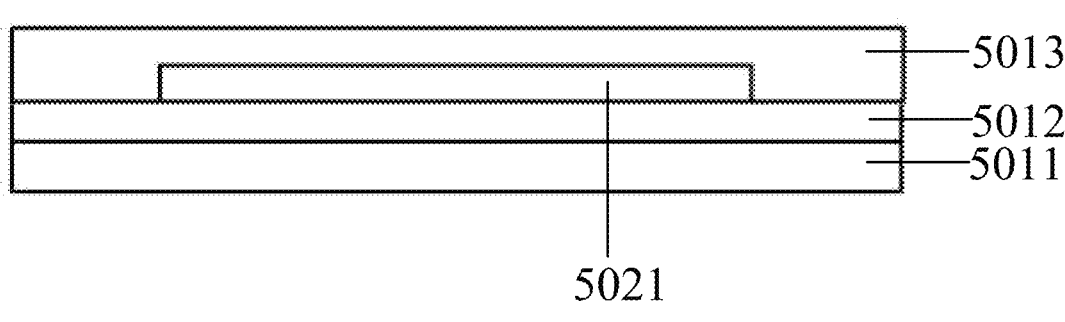
FIG. 8B
FIG. 8C

5013

5012
5011

5020

5021A     5021     5021B 5013A     5013B

5013

5012
5011

5021A     5021     5021B

5013

5012
5011

5023   5021A   5022   5021   5021B   5024

6015
6014
6013
6012
6011

6023     6022     6021     6024     102 101 103

6012A 6012
6011

101

6012
6011

6021     101     103

6013
6012
6011

6021     101     103

PHOTOELECTRIC SENSOR AND SUBSTRATE

This application is a U.S. National Phase Entry of International Application No. PCT/CN2021/135035 filed on Dec. 2, 2021, designating the United States of America.

TECHNICAL FIELD

At least one embodiment of the present disclosure relates to a photoelectric sensor and a substrate.

BACKGROUND

A photoelectric sensor is a device that converts a light signal into an electrical signal. For example, the photoelectric sensor can be integrated on various substrates, such as a display substrate, to achieve functions such as optical compensation and screen fingerprint recognition. The photoelectric sensor has low cost, and hence is widely used in many fields such as display.

SUMMARY

At least one embodiment of the present disclosure provides a photoelectric sensor, including: a photoelectric conversion layer, a first electrode, arranged on a side of the photoelectric conversion layer, and a second electrode, arranged on a side of the photoelectric conversion layer and spaced apart from the first electrode; the first electrode and the second electrode are configured to drive the photoelectric conversion layer; and in a direction perpendicular to a surface of the photoelectric conversion layer, the first electrode and the second electrode are respectively overlapped with the photoelectric conversion layer; and the photoelectric conversion layer includes an oxide semiconductor material.\

For example, in the photoelectric sensor provided by at least one embodiment of the present disclosure, a work function of a material of at least one of the first electrode and the second electrode is greater than an electron affinity of a material of the photoelectric conversion layer by more than 0.65 eV.

For example, in the photoelectric sensor provided by at least one embodiment of the present disclosure, the oxide semiconductor material includes at least one of IGZO, ITZO and IGTO.

For example, in the photoelectric sensor provided by at least one embodiment of the present disclosure, a material of at least one of the first electrode and the second electrode includes at least one of ITO, TiN and Mo.

For example, the photoelectric sensor provided by at least one embodiment of the present disclosure further includes: a dielectric layer, arranged between the first electrode and the photoelectric conversion layer and/or between the second electrode and the photoelectric conversion layer.

For example, in the photoelectric sensor provided by at least one embodiment of the present disclosure, a material of the dielectric layer includes silicon oxide or silicon nitride.

For example, the photoelectric sensor provided by at least one embodiment of the present disclosure further includes: a protective layer, arranged on a side of the photoelectric conversion layer away from the first electrode, and including an opening exposing the photoelectric conversion layer.

At least one embodiment of the present disclosure further provides a substrate, including: a base substrate, the photoelectric sensor provided by the embodiment of the present disclosure; and a switching transistor, arranged on the base substrate; in a direction perpendicular to the base substrate, the photoelectric sensor is overlapped with the switching transistor; or in a direction parallel to the base substrate, the photoelectric sensor and the switching transistor are arranged side by side.

For example, in the substrate provided by at least one embodiment of the present disclosure, the switching transistor is arranged on a side of the photoelectric sensor away from the base substrate, the switching transistor includes a first source-drain electrode, and the first source-drain electrode is electrically connected with one of the first electrode and the second electrode of the photoelectric sensor.

For example, in the substrate provided by at least one embodiment of the present disclosure, the second electrode of the photoelectric sensor is arranged on a side of the first electrode away from the base substrate, the first source-drain electrode is electrically connected with the second electrode; and in the direction perpendicular to the base substrate, the first source-drain electrode is at least partially overlapped with the second electrode.

For example, in the substrate provided by at least one embodiment of the present disclosure, the switching transistor is arranged on the side of the photoelectric sensor away from the base substrate, the second electrode of the photoelectric sensor is arranged on a side of the first electrode away from the base substrate, the switching transistor includes an active layer arranged on a side of the second electrode away from the base substrate and a gate electrode arranged on a side of the active layer away from the base substrate, and the second electrode is reused as another gate electrode of the switching transistor.\

For example, in the substrate provided by at least one embodiment of the present disclosure, in the direction perpendicular to the base substrate, the gate electrode and the second electrode are at least partially overlapped.

For example, in the substrate provided by at least one embodiment of the present disclosure, the switching transistor includes a first source-drain electrode, and the first source-drain electrode is reused as the first electrode or the second electrode of the photoelectric sensor.

For example, in the substrate provided by at least one embodiment of the present disclosure, the photoelectric sensor is arranged on a side of the switching transistor away from the base substrate, the switching transistor further includes an active layer and a gate electrode; and in the direction perpendicular to the base substrate, the gate electrode and the photoelectric sensor are located on opposite sides of the active layer respectively or located on a same side of the active layer.

For example, in the substrate provided by at least one embodiment of the present disclosure, the switching transistor includes a gate electrode, and the gate electrode is reused as the first electrode or the second electrode of the photoelectric sensor.

For example, in the substrate provided by at least one embodiment of the present disclosure, the photoelectric sensor is arranged on a side of the switching transistor away from the base substrate, the switching transistor includes an active layer and the gate electrode, the gate electrode is on a side of the active layer away from the base substrate, and is reused as the second electrode; the photoelectric conversion layer is arranged on a side of the gate electrode away from the base substrate, and the first electrode is arranged on a side of the photoelectric conversion layer away from the base substrate.

3

For example, in the substrate provided by at least one embodiment of the present disclosure, the switching transistor further includes a first source-drain electrode and a second source-drain electrode electrically connected with the active layer, and the first source-drain electrode and the second source-drain electrode are arranged in a same layer as the gate electrode.

For example, in the substrate provided by at least one embodiment of the present disclosure, in the direction perpendicular to the base substrate, the photoelectric conversion layer is at least partially overlapped with the active layer.

For example, in the substrate provided by at least one embodiment of the present disclosure, in the case where the photoelectric sensor and the switching transistor are arranged side by side in the direction parallel to the base substrate, the switching transistor includes a first source-drain electrode, and the first source-drain electrode is arranged in a same layer as the first electrode or the second electrode of the photoelectric sensor.

For example, in the substrate provided by at least one embodiment of the present disclosure, the first source-drain electrode is integrally connected with the first electrode or the second electrode of the photoelectric sensor.

For example, in the substrate provided by at least one embodiment of the present disclosure, the switching transistor further includes a gate electrode, and the gate electrode is arranged in a same layer as the first source-drain electrode.

For example, in the substrate provided by at least one embodiment of the present disclosure, the switching transistor further includes an active layer, and the active layer and the photoelectric conversion layer are arranged in a same layer.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

4

Figure 1A:
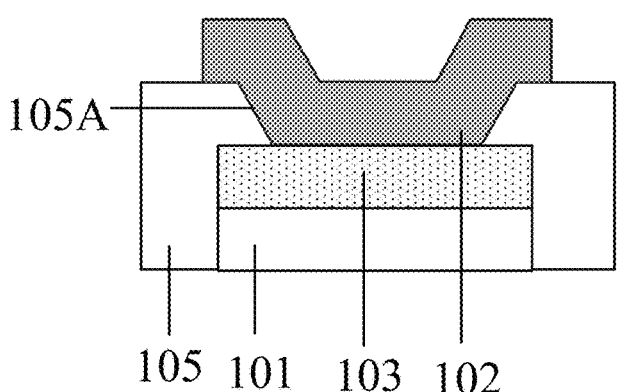
FIG. 1A is a schematic diagram of a photoelectric sensor provided by at least one embodiment of the present disclosure.
Figure 2:
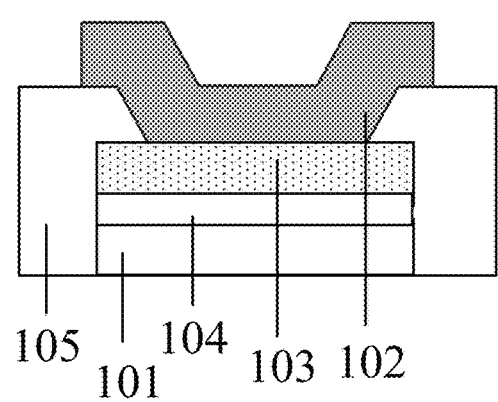
FIG. 2 is a schematic diagram of a photoelectric sensor provided by at least one embodiment of the present disclosure.
Figure 3A:
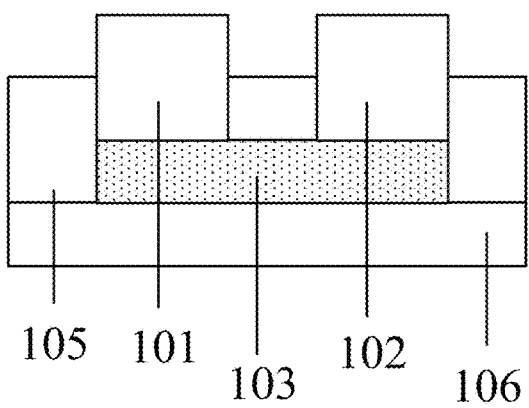
FIG. 3A is a schematic diagram of a photoelectric sensor provided by at least one embodiment of the present disclosure.
Figure 5A:
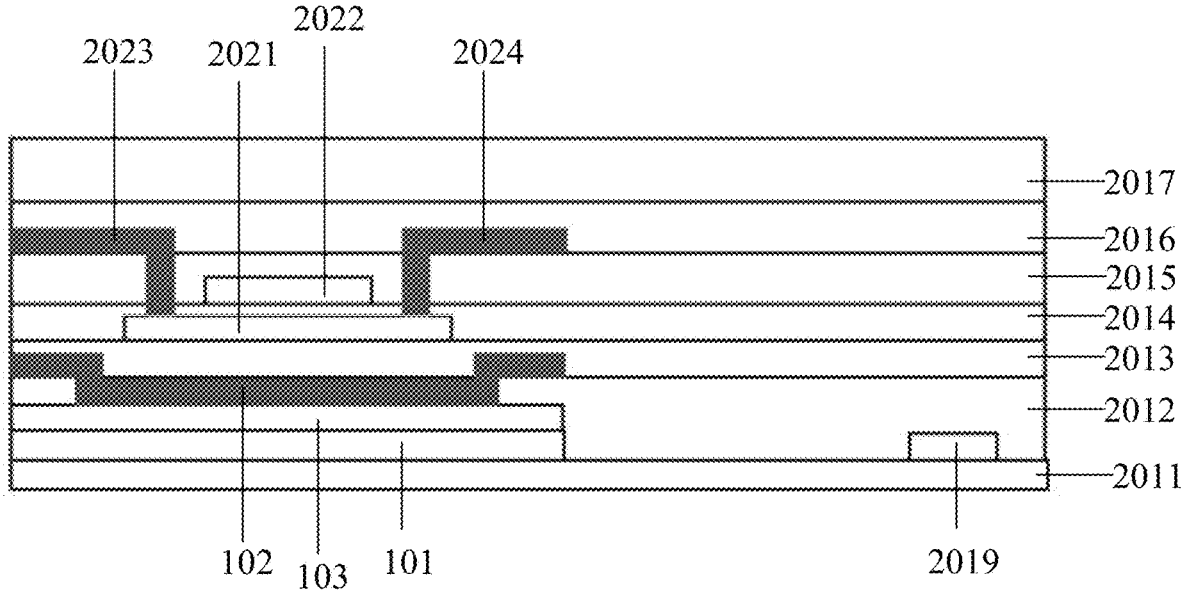
FIG. 5A is a schematic diagram of a photoelectric sensor provided by at least one embodiment of the present disclosure.
Figure 5B:
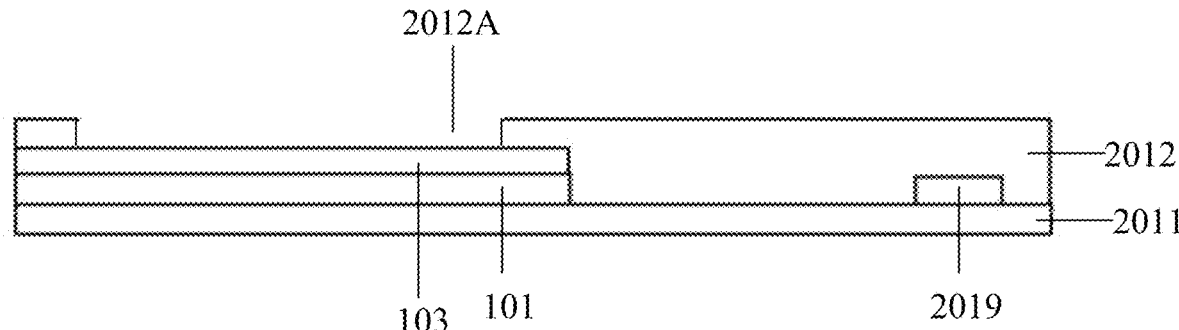
Figure 5C:
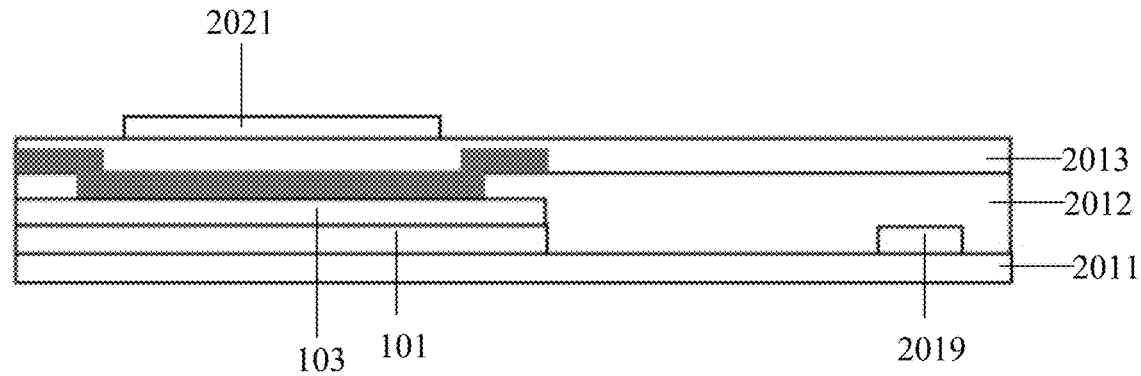
Figure 5D:
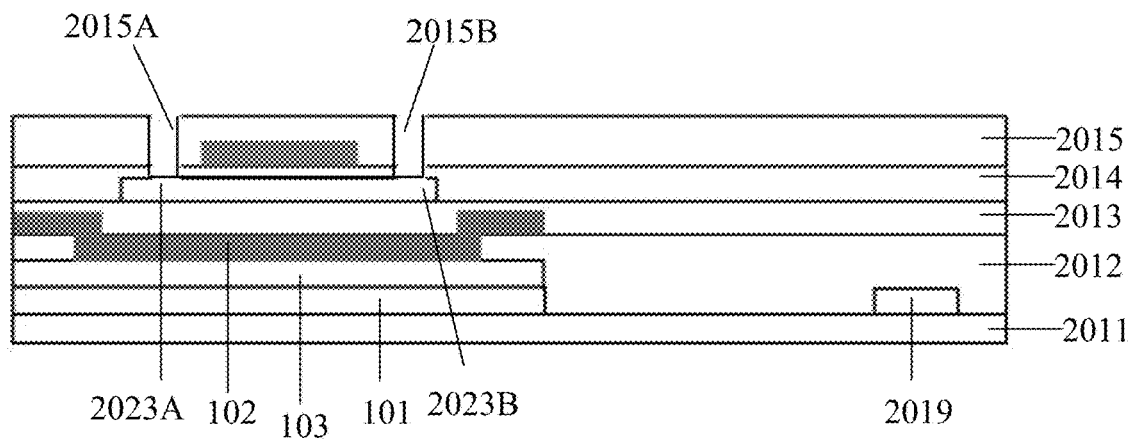
Figure 6A:
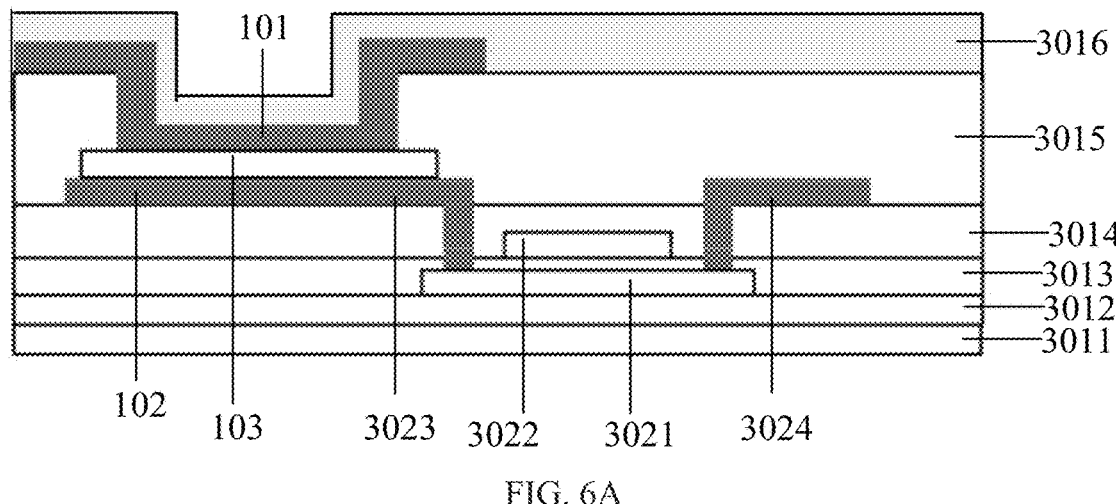
Figure 7A:
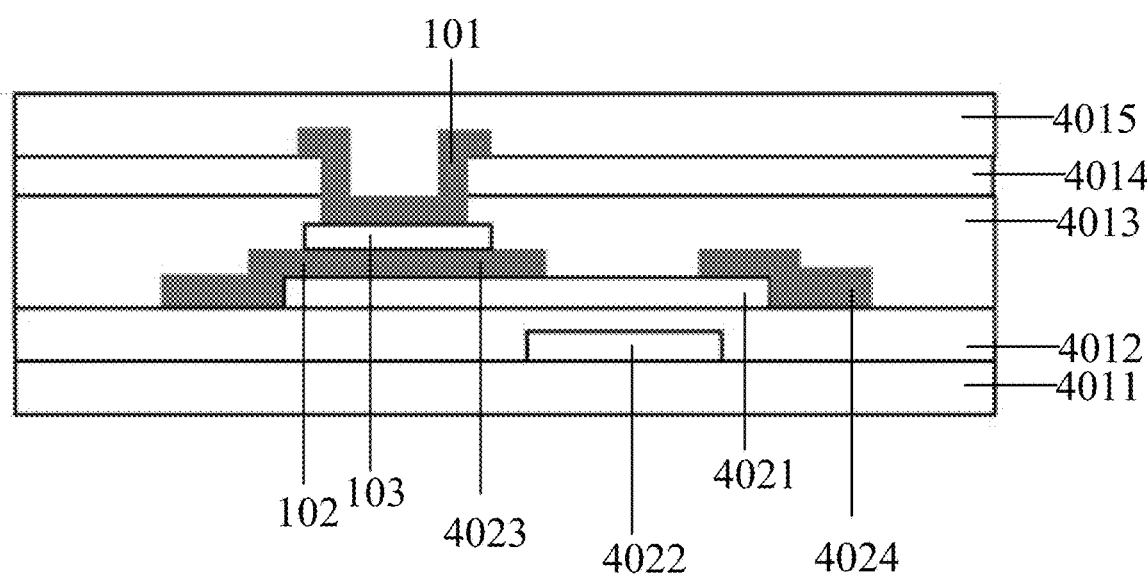
Figure 7B:
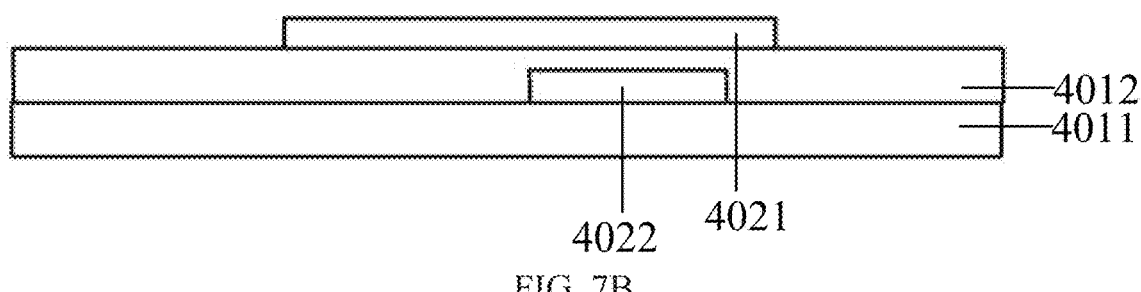
Figure 7C:
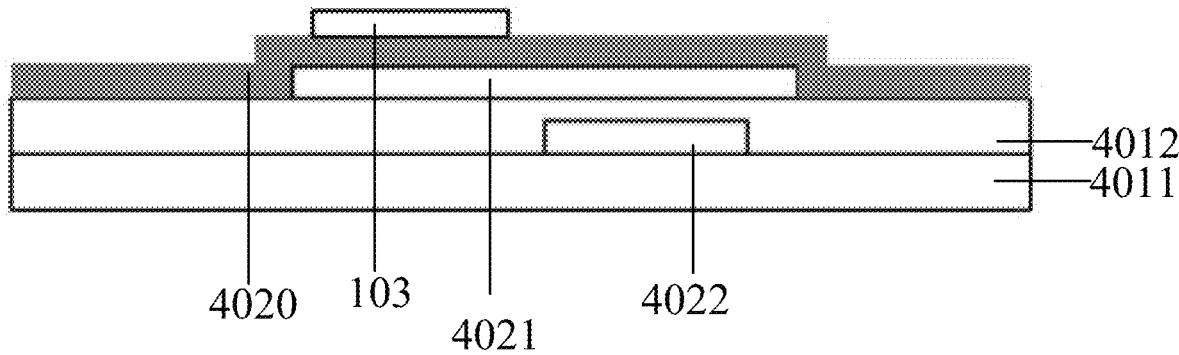
Figure 7D:
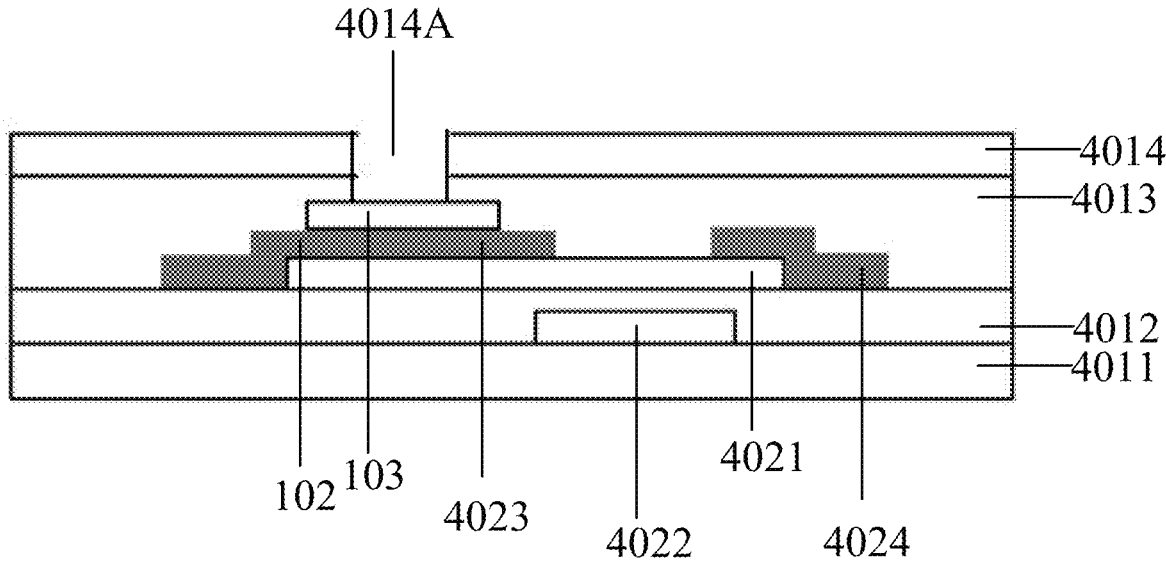
Figure 8D:
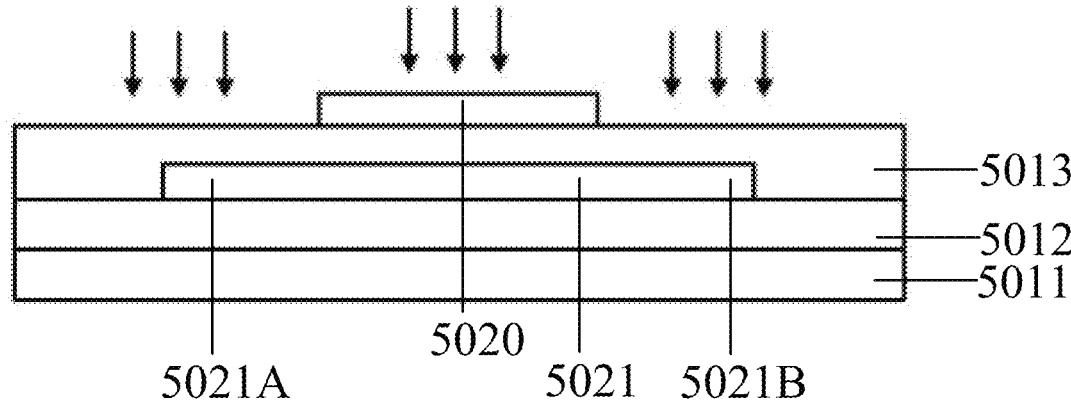
Figure 9A:
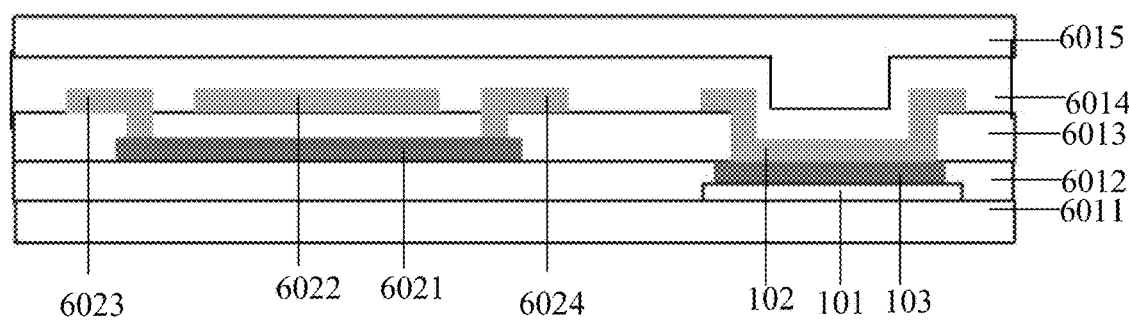
Figure 10:
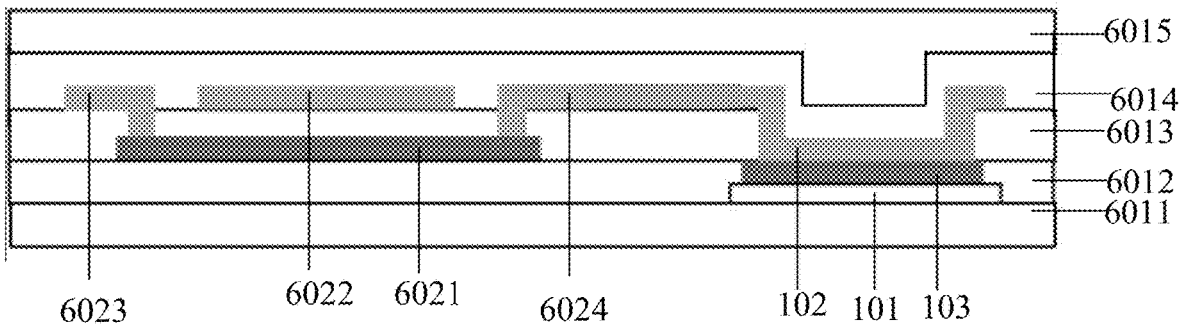
Figure 11A:
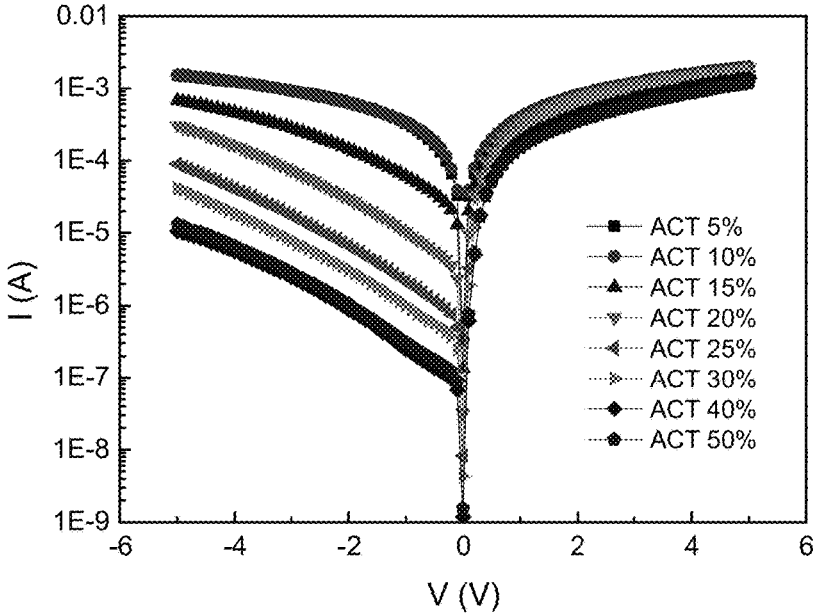
Figure 11B:
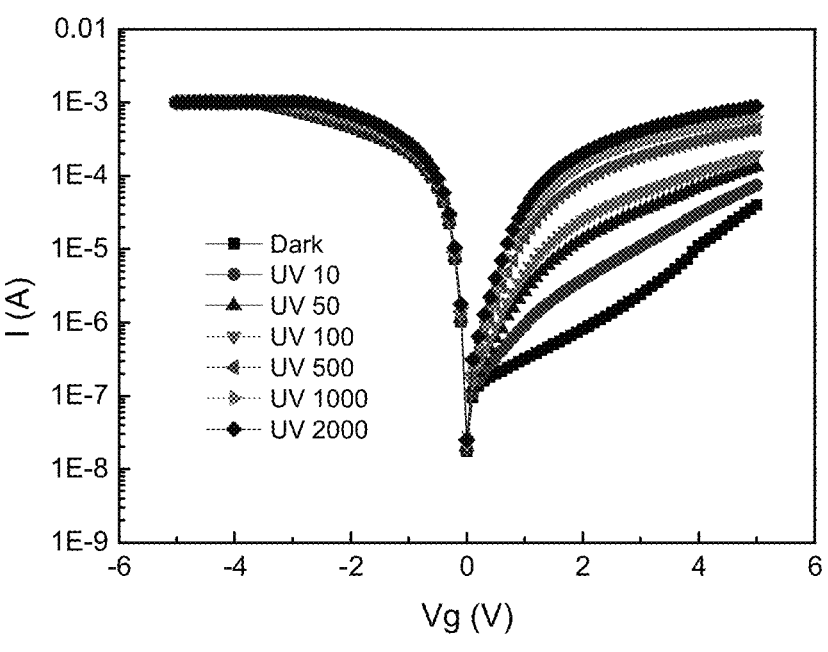
Figure 11C:
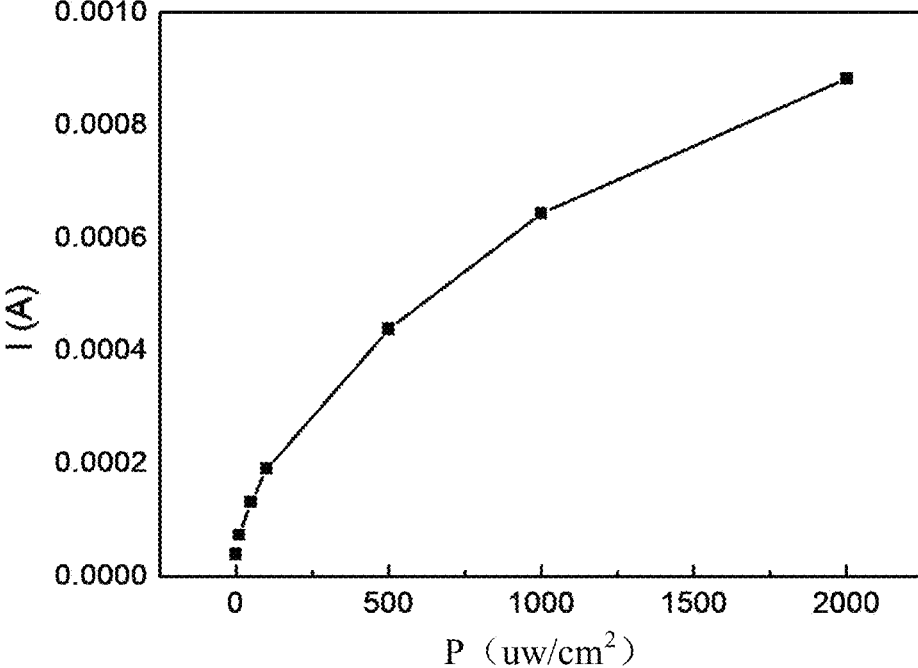
Figure 12A:
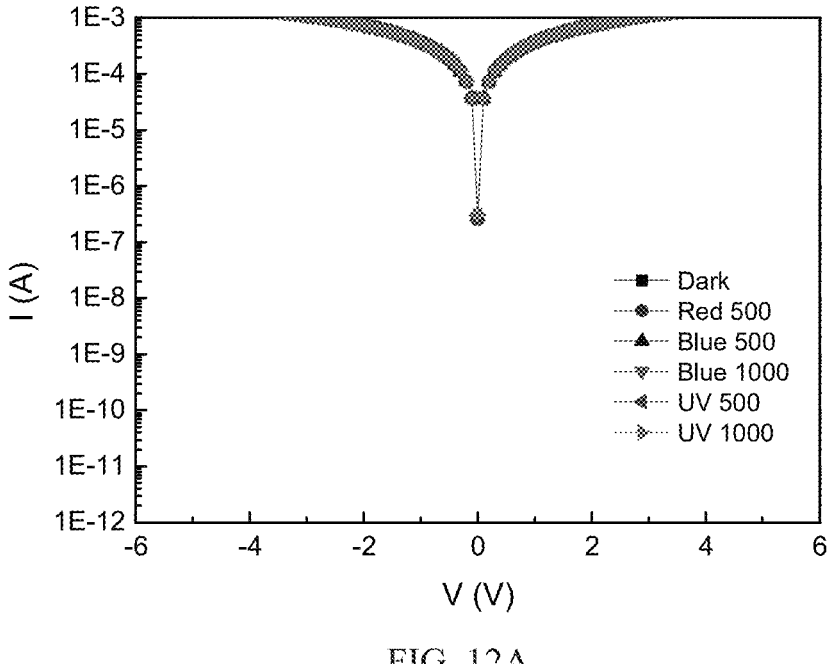
Figure 12B:
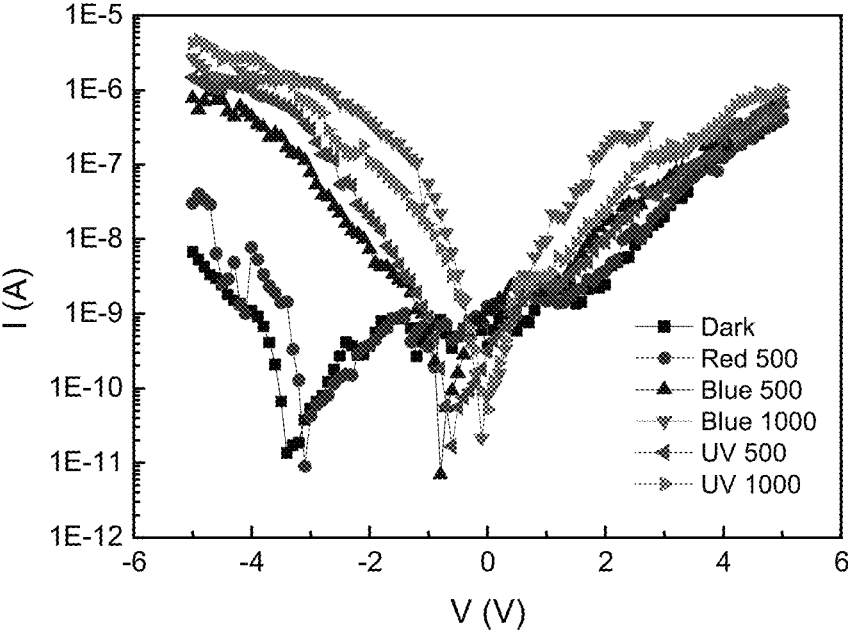
Figure 12C:
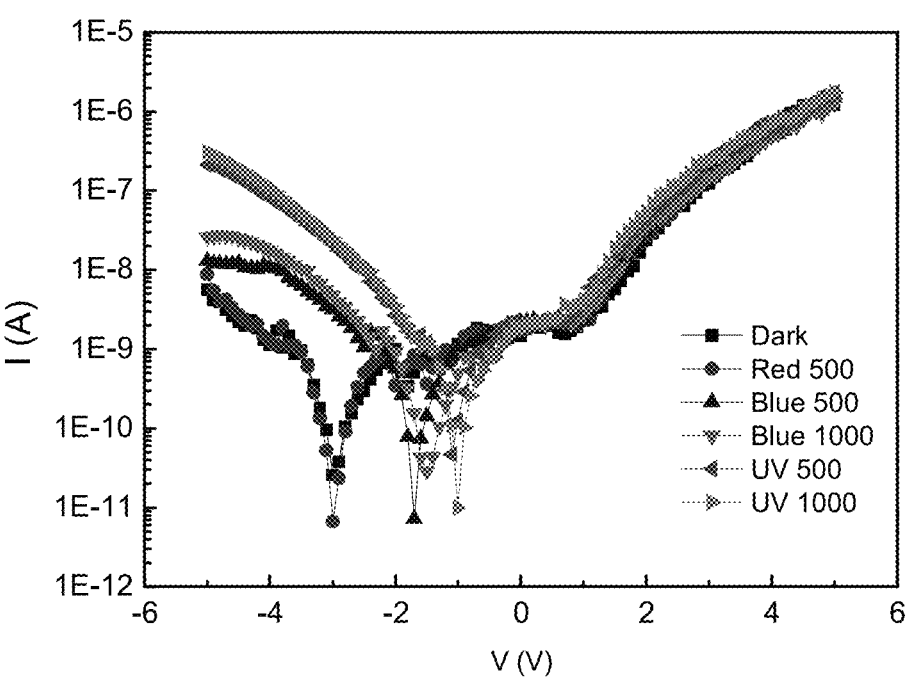
Figure 13:
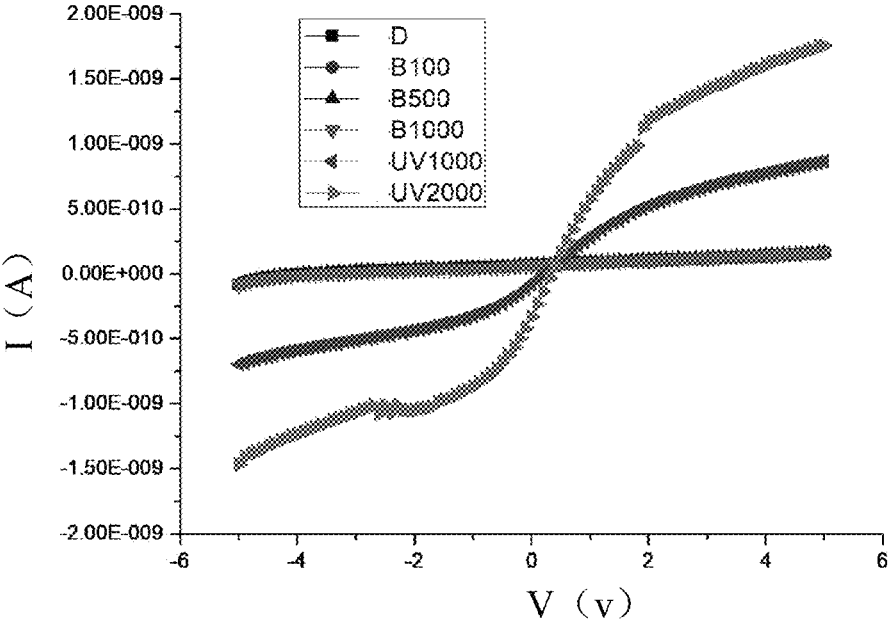

FIG. 5B to FIG. 5D are schematic diagrams of the photoelectric sensor in FIG. 5A during a manufacturing process;

FIG. 6A is a schematic diagram of a photoelectric sensor provided by at least one embodiment of the present disclosure;

FIG. 6B to FIG. 6E are schematic diagrams of the photoelectric sensor in FIG. 6A during a manufacturing process;

FIG. 7A is a schematic diagram of a photoelectric sensor provided by at least one embodiment of the present disclosure;

FIG. 7B to FIG. 7D are schematic diagrams of the photoelectric sensor in FIG. 7A during a manufacturing process;

FIG. 8A is a schematic diagram of a photoelectric sensor provided by at least one embodiment of the present disclosure;

FIG. 8B to FIG. 8F are schematic diagrams of the photoelectric sensor in FIG. 8A during a manufacturing process;

FIG. 9A is a schematic diagram of a photoelectric sensor provided by at least one embodiment of the present disclosure;

FIG. 9B to FIG. 9G are schematic diagrams of the photoelectric sensor in FIG. 9A during a manufacturing process;

FIG. 10 is a schematic diagram of a photoelectric sensor provided by at least one embodiment of the present disclosure;

FIG. 11A to FIG. 11C illustrate data graphs of the photoelectric sensor in FIG. 1A under multiple tests;

FIG. 12A and FIG. 12B to FIG. 12C respectively illustrate data graphs of the photoelectric sensor in FIG. 2 under multiple tests when there is a dielectric layer and when there is no dielectric layer; and FIG. 13 illustrates a data graph of the photoelectric sensor in FIG. 3A under test.

DETAILED DESCRIPTION

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left"

and the like are only used to indicate relative position relationship, and when the position of the described object is changed, the relative position relationship may be changed accordingly.

At present, substrate with photoelectric sensor on the market mainly uses amorphous silicon PIN having good light absorption effect for a wavelength of 300 nm to 650 nm as the photoelectric sensor. However, amorphous silicon PIN also has strong absorption effect for ambient light, and is poor in spectral selectivity which is not conducive to the application in the field of optical communication; moreover, the substrate usually has an amplifier circuit based on a TFT (Thin Film Transistor) with an oxide semiconductor used as an active layer, and in a process of manufacturing the above-mentioned amorphous silicon PIN on the substrate, for example, in a process of plasma etching, a large amount of hydrogen will be used, at this time, hydrogen atoms will be diffused to an oxide channel of the TFT so that a threshold voltage Vth of the TFT is negatively biased and even generates a large current, causing the TFT to lose its switching characteristics; therefore, when the amorphous silicon PIN is integrated with the above-mentioned TFT, it is necessary to add a hydrogen barrier film layer, or to increase an oxygen content of a film layer adjacent to the oxide channel to neutralize the excess hydrogen, but these processes all increase the complexity of the manufacture.

At least one embodiment of the present disclosure provides a photoelectric sensor, the photoelectric sensor includes a photoelectric conversion layer, a first electrode and a second electrode, the first electrode is arranged on a side of the photoelectric conversion layer, and the second electrode is arranged on a side of the photoelectric conversion layer and is spaced apart from the first electrode; the first electrode and the second electrode are configured to drive the photoelectric conversion layer, and in a direction perpendicular to a surface of the photoelectric conversion layer, the first electrode and the second electrode are respectively overlapped with the photoelectric conversion layer, and the photoelectric conversion layer includes an oxide semiconductor material.

In the photoelectric sensor provided by the embodiment of the present disclosure, the photoelectric conversion layer is made of an oxide semiconductor material, so as to reduce the absorption for long-wavelength light (such as red light with a wavelength greater than 601 nm) and increase the signal selection ratio, on the basis of ensuring the absorption for short-wavelength signal light; moreover, the photoelectric conversion layer is made of an oxide semiconductor material, so that the manufacturing process of the photoelectric sensor is compatible with the manufacturing process of the above-mentioned TFT, thereby simplifying the manufacturing process when the photoelectric sensor is used on the substrate. The photoelectric sensor can be applied, for example, to the fields of anti-environmental light fingerprint identification, ambient light compensation and visible light communication, etc.

In the following, the photoelectric sensor and the substrate provided by the embodiments of the present disclosure will be described in detail through several specific embodiments.

At least one embodiment of the present disclosure provides a photoelectric sensor, and FIG. 1A illustrates a schematic diagram of the photoelectric sensor, as illustrated in FIG. 1A, the photoelectric sensor includes a photoelectric conversion layer 103, a first electrode 101 and a second electrode 102.

For example, the first electrode 101 is arranged on a side (illustrated as a lower side in FIG. 1A) of the photoelectric conversion layer 103, the second electrode 102 is arranged on another side (illustrated as the upper side in FIG. 1A) of the photoelectric conversion layer 103 and is spaced apart from the first electrode 101. For example, in a direction perpendicular to a surface of the photoelectric conversion layer 103 (that is, the vertical direction in the figure), the first electrode 101 and the second electrode 102 are overlapped with the photoelectric conversion layer 103, respectively. In this way, the first electrode 101 and the second electrode 102 can respectively apply electrical signals to the photoelectric conversion layer 103 to drive the photoelectric conversion layer 103.

For example, the photoelectric conversion layer 103 includes an oxide semiconductor material. For example, the oxide semiconductor material may be an oxide semiconductor material having a high mobility with a band gap between 2.7 eV and 3.3 eV. For example, the aforementioned oxide semiconductor material may include at least one of IGZO, ITZO and IGTO. For example, IGZO can respond to ultraviolet light (UV light), and ITZO and IGTO can respond to blue light.

For example, in the case where the photoelectric sensor is used for fingerprint identification, because the finger can block the ambient light with a wavelength below 600 nm and the above-mentioned oxide semiconductor material is not sensitive to red light, it's not necessary for the photoelectric sensor to be provided with a long-wavelength filter layer. In this way, the structure of the photoelectric sensor can be simplified, and the cost can be reduced.

For example, in some embodiments, as illustrated in FIG. 1A, the photoelectric sensor may further include a protective layer 105, the protective layer 105 covers at least a part of the first electrode 101 and of the photoelectric conversion layer 103. For example, the protective layer 105 is arranged on a side of the photoelectric conversion layer 103 away from the first electrode 101, and includes an opening 105A exposing the photoelectric conversion layer 103. Because the first electrode 101 and the second electrode 102 can be formed by etching with a same etchant during the manufacturing process, the protective layer 105 can be added to separate the first electrode 101 from the second electrode 102, in order to prevent the first electrode 101 having been formed from being damaged during forming the second electrode 102 by patterning. For example, a material of the protective layer 105 may be an organic material such as acrylic, siloxane, polyimide, or an inorganic material such as silicon oxide and silicon nitride.

Figure 1B:
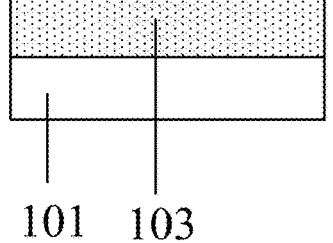
FIG. 1B to FIG. 1C are schematic diagrams of the photoelectric sensor in FIG. 1A during a manufacturing process.
Figure 1C:
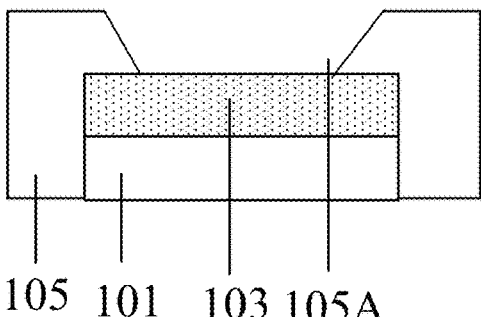

For example, FIGS. 1B and 1C illustrate schematic diagrams of the photoelectric sensor illustrated in FIG. 1A during the manufacturing process. For example, as illustrated in FIG. 1B, during manufacturing the photoelectric sensor, firstly, a first electrode material layer is formed on the substrate, such as a glass substrate, by a process such as deposition or sputtering, then the first electrode material layer is patterned to form the first electrode 101; then a photoelectric conversion material layer is formed on the first electrode 101 by a process such as deposition, and the photoelectric conversion material layer is patterned to form the photoelectric conversion layer 103; afterwards, as illustrated in FIG. 1C, a protective material layer 105 is formed on the photoelectric conversion layer 103 by a process such as deposition or coating, and the protective material layer 105 is patterned to form an opening 105A exposing the photoelectric conversion layer 103; afterwards, as illustrated in FIG. 1A, a second electrode material layer is formed on the photoelectric conversion layer 103 by a process such as deposition or sputtering, and the second electrode material layer is patterned to form the second electrode 102.

For example, in this embodiment, the first electrode 101 can be a transparent electrode, such as an ITO transparent electrode, the photoelectric conversion layer 103 can be made of at least one of the above-mentioned IGZO, ITZO and IGTO, and the second electrode 102 may be made of a metal electrode, such as a molybdenum electrode. For example, a functional layer such as an encapsulation layer or a protective layer may also be formed on the second electrode 102, which is not limited in the embodiment of the present disclosure.

For example, in the embodiments of the present disclosure, a single patterning process includes steps such as photoresist formation, exposure, development, and etching; for details, reference may be made to related technologies, which will not be repeated herein.

For example, in some embodiments, the work function of at least one of the material of the first electrode 101 and the material of the second electrode 102 is greater than an electron affinity of the material of the photoelectric conversion layer 103 by more than 0.65 eV. In this way, potential barrier among the electrodes and the photoelectric conversion layer 103 can be reduced, so that a dark state current of the photoelectric sensor is reduced, and a comprehensive performance of the photoelectric sensor is improved.

For example, in some embodiments, at least one of the material of the first electrode 101 and the material of the second electrode 102 includes at least one of ITO, TiN and Mo. These materials have a high work function, and thus can increase the difference in electron affinity from the material of the photoelectric conversion layer 103. For instance, in some examples, both the first electrode 101 and the second electrode 102 can use the above-mentioned materials with a higher work function; or in some other examples, one of the first electrode 101 and the second electrode 102 adopts the above-mentioned material with a higher work function, the other one can be made of copper, aluminum, magnesium and other electrode materials to reduce the manufacturing cost.

For example, for the photoelectric sensor illustrated in FIG. 1A, in the case where the first electrode 101 is an ITO electrode, the second electrode 102 is a Mo electrode and the photoelectric conversion layer 103 is an IGZO layer, the photoelectric sensor can respond to UV light. After performing a test to the photoelectric sensor, FIG. 11A illustrates a relationship between the dark state current I and the oxygen content of the IGZO layer, in which ACT5% means the oxygen content of the IGZO layer is 5%, ACT10% means the oxygen content of the IGZO layer is 10%, and so on; FIG. 11B illustrates a response relationship of the photoelectric sensor to different intensities (with an intensity unit of uW/cm$^2$) of UV light when the oxygen content of the IGZO layer is 50%, for example, in FIG. 11B, UV2000 means the intensity of UV light is 2000 uW/cm$^2$, UV1000 means the intensity of UV light is 1000 uW/cm$^2$, and so on; Dark represents a dark state, that is, there is no light; FIG. 11C is a schematic diagram illustrating a variation of photocurrent I with light intensity (P) when the oxygen content of IGZO is 50% and the electrode voltage is 4V.

For example, as illustrated in FIG. 11A, in the case where the oxygen content of the IGZO layer is in the range of 5% to 50%, under the same electrode voltage V, as the oxygen content increases, the dark state current decreases; for example, in some embodiments, the oxygen content of the IGZO layer can be controlled within a range of 40% to 50%. As illustrated in FIG. 11B, under a same electrode voltage Vg, the higher the UV light intensity, the larger the photocurrent generated by the photoelectric sensor. As illustrated in FIG. 11C, in the case where the oxygen content of IGZO is 50% and the electrode voltage is 4V, the photocurrent I increases with the increase of UV light intensity.

For example, in some embodiments, as illustrated in FIG. 2, the photoelectric sensor may further include a dielectric layer 104, the dielectric layer 104 is arranged between the first electrode 101 and the photoelectric conversion layer 103 and/or between the second electrode 102 and the photoelectric conversion layer 103; FIG. 2 illustrates the case where the dielectric layer 104 is arranged between the first electrode 101 and the photoelectric conversion layer 103.

For instance, in some examples, a material of the dielectric layer 104 includes inorganic materials such as silicon oxide or silicon nitride. The dielectric layer 104 serves as a tunneling dielectric layer, which can properly increase resistance but also transfer electrons. For example, a thickness of the dielectric layer 104 may be from 1 nm to 10 nm, such as 5 nm. For example, during the manufacturing process, after the photoelectric conversion layer 103 is formed, the dielectric layer 104 can be formed by forming a dielectric material layer on the photoelectric conversion layer 103 and patterning the dielectric material layer.

For example, for the photoelectric sensor of FIG. 2, in the case where the first electrode 101 is an ITO electrode, the second electrode 102 is a Mo electrode and the photoelectric conversion layer 103 is an IGTO layer or an ITZO layer, the photoelectric sensor can respond to blue light. After performing a test to the photoelectric sensor, FIG. 12A is a schematic diagram illustrating the variation of the photocurrent with the light intensity in the case where there is no dielectric layer 104 between the photoelectric conversion layer 103 and the electrode layer, and the photoelectric conversion layer 103 has a thickness of 50 nm and an oxygen content of 80%, under a dark state (Dark) in which red light intensity is 500 uW/cm$^2$ (illustrated as Red500 in FIG. 12A), blue light intensity is 500 uW/cm$^2$ and 1000 uW/cm$^2$ (illustrated as Blue500 and Blue1000 in FIG. 12A), and UV light intensity is 500 uW/cm$^2$ and 1000 uW/cm$^2$ (illustrated as UV500 and UV1000 in FIG. 12A); FIG. 12B is a schematic diagram illustrating the variation of the photocurrent with the light intensity in the case where the photoelectric conversion layer 103 is an IGTO layer, and there is a dielectric layer 104 between the photoelectric conversion layer 103 and the electrode layer, and the photoelectric conversion layer 103 has a thickness of 50 nm and an oxygen content of 80%, under a dark state (Dark) in which the red light intensity is 500 uW/cm$^2$ (illustrated as Red500 in FIG. 12B), the blue light intensity is 500 uW/cm$^2$ and 1000 uW/cm$^2$ (illustrated as Blue500 and Blue1000 in FIG. 12B), and the UV light intensity is 500 uW/cm$^2$ and 1000 uW/cm$^2$ (illustrated as UV500 and UV1000 in FIG. 12B); FIG. 12C is a schematic diagram illustrating the variation of the photocurrent with the light intensity in the case where the photoelectric conversion layer 103 is an ITZO layer, and there is a dielectric layer 104 between the photoelectric conversion layer 103 and the electrode layer, and the photoelectric conversion layer 103 has a thickness of 200 nm and an oxygen content of 30%, under a dark state (Dark) in which the red light intensity is 500 uW/cm$^2$ (illustrated as Red500 in FIG. 12C), the blue light intensity is 500 uW/cm$^2$ and 1000 uW/cm$^2$ (illustrated as Blue500 and Blue1000 in FIG. 12C), and the UV light intensity is 500 uW/cm$^2$ and 1000 uW/cm$^2$ (illustrated as UV500 and UV1000 in FIG. 12C).

For example, as illustrated in FIG. 12A, in the case where no dielectric layer 104 is provided between the photoelectric conversion layer 103 and the electrode layer, values of the photocurrent under various light intensities are basically the same, that is, no different photoresponse is produced and the dark state current is higher. As illustrated in FIG. 12B, in the case where the photoelectric conversion layer 103 is an IGTO layer and the dielectric layer 104 is provided between the photoelectric conversion layer 103 and the electrode layer, under the same electrode voltage V, the photocurrent increases with the light intensity, and the dark-state current decreases greatly. As illustrated in FIG. 12C, in the case where the photoelectric conversion layer 103 is an ITZO layer and the dielectric layer 104 is provided between the photoelectric conversion layer 103 and the electrode layer, under the same electrode voltage V, the photocurrent increases with the light intensity, and the dark-state current decreases greatly. It can be seen that, by adding the dielectric layer 104, the performance of the photoelectric sensor can be greatly improved.

For example, in the above-mentioned embodiments, the photoelectric sensor has a vertical structure, and the photoelectric conversion layer 103 is sandwiched between the first electrode 101 and the second electrode 102. For example, in some other embodiments, the photoelectric sensor may also have a parallel structure as illustrated in FIG. 3A. For example, as illustrated in FIG. 3A, the photoelectric conversion layer 103 is arranged on a buffer layer 106, the buffer layer 106 can be made of, for example, inorganic materials such as silicon oxide and silicon nitride. The first electrode 101 and the second electrode 102 are arranged on a same side of the photoelectric conversion layer 103, and are spaced apart from each other and opposite to each other. In this way, the first electrode 101 and the second electrode 102 can also respectively apply electrical signals to the photoelectric conversion layer 103 to drive the photoelectric conversion layer 103.

Figure 3B:
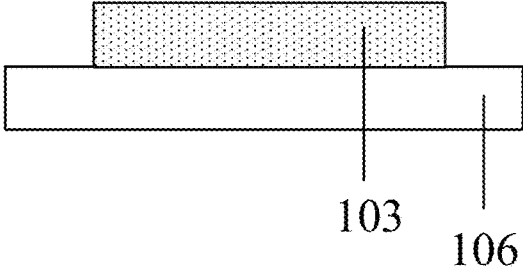
FIG. 3B to FIG. 3C are schematic diagrams of the photoelectric sensor in FIG. 3A during a manufacturing process.
Figure 3C:
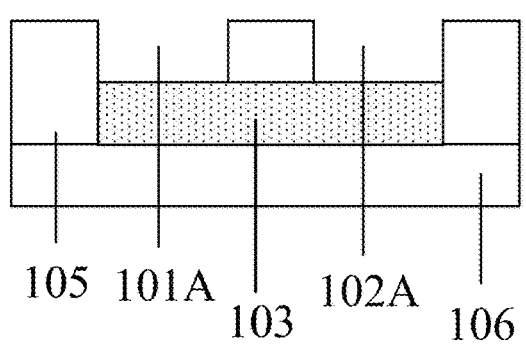

For example, FIGS. 3B to 3C illustrate schematic diagrams of the photoelectric sensor in FIG. 3A during the manufacturing process. As illustrated in FIG. 3B, in the manufacturing process, firstly, a photoelectric conversion material layer is formed on the buffer layer 106 by a process such as deposition or sputtering, and the photoelectric conversion material layer is patterned to form the photoelectric conversion layer 103; afterwards, as illustrated in FIG. 3C, a protective material layer 105 is formed on the photoelectric conversion layer 103 by a process such as deposition or coating, and the protective material layer 105 is patterned to form openings 101A and 101B exposing the photoelectric conversion layer 103; afterwards, as illustrated in FIG. 3A, an electrode material layer is formed on the photoelectric conversion layer 103 and the protective material layer 105 by a process such as deposition or sputtering, and the electrode material layer is patterned, and the first electrode 101 and the second electrode 102 are formed at the same time.

For example, in the above-mentioned embodiment, both the first electrode 101 and the second electrode 102 can be transparent electrodes, such as ITO transparent electrodes, the photoelectric conversion layer 103 may be made of at least one of the aforementioned IGZO, ITZO, and IGTO. For example, a functional layer such as an encapsulation layer or a protective layer may also be formed on the first electrode 101 and the second electrode 102, which is not limited in the embodiment of the present disclosure.

For the photoelectric sensor illustrated in FIG. 3A, in the case where both the first electrode 101 and the second electrode 102 are ITO electrodes and the photoelectric conversion layer 103 is an IGZO layer, the photoelectric sensor can respond to UV light. FIG. 13 illustrates response characteristics of the photoelectric sensor to different types of light, for example, FIG. 13 illustrates the variation of the photocurrent with the light intensity under a dark state (D) in which the blue light intensity is 100 uW/cm$^2$, 500 uW/cm$^2$ and 1000 uW/cm$^2$ (illustrated in the figure as B100, B500 and B1000), and the UV light intensity is 1000 uW/cm$^2$ and 2000 uW/cm$^2$ (illustrated in the figure as UV1000 and UV2000). It can be seen that, under a same electrode voltage V, the photocurrent increases with the increase of the light intensity.

In the above-mentioned photoelectric sensor provided by the embodiment of the present disclosure, the photoelectric conversion layer is made of an oxide semiconductor material, which can absorb short-wavelength signal light such as ultraviolet light or blue light based on material characteristics, and reduce the absorption or has no absorption of long-wavelength light, thereby improving the signal selection ratio; moreover, the photoelectric conversion layer of the photoelectric sensor is made of an oxide semiconductor material, so that the manufacturing process of the photoelectric sensor is compatible with the manufacturing process of a TFT based on an oxide semiconductor used as the active layer; in this way, when the photoelectric sensor is used on the substrate, the manufacturing process can be simplified, the cost can be reduced, and mass production can be realized.

At least one embodiment of the present disclosure further provides a substrate, which includes a base substrate, the photoelectric sensor provided by any one of the embodiments of the present disclosure, and a switching transistor. For example, the photoelectric sensor is arranged on the base substrate, and the switching transistor is also arranged on the base substrate; and in a direction perpendicular to the base substrate, the photoelectric sensor and the switching transistor are overlapped, or in a direction parallel to the base substrate, the photoelectric sensor and the switching transistor are arranged side by side. For example, the switching transistor may be a transistor with switching characteristics such as a thin film transistor.

For example, in the following embodiments, the direction perpendicular to the base substrate is the vertical direction in the figure, and the direction parallel to the base substrate is the horizontal direction in the figure. In the direction parallel to the base substrate, the photoelectric sensor and the switching transistor are arranged side by side, which means that in a top view of the substrate, a positional relationship between the photoelectric sensor and the switching transistor is juxtaposition, for example, most of the main functional structures of the photoelectric sensor and the switching transistor have no overlap, or, the photoelectric sensor as a whole does not overlap with the switching transistor as a whole.

Figure 4A:
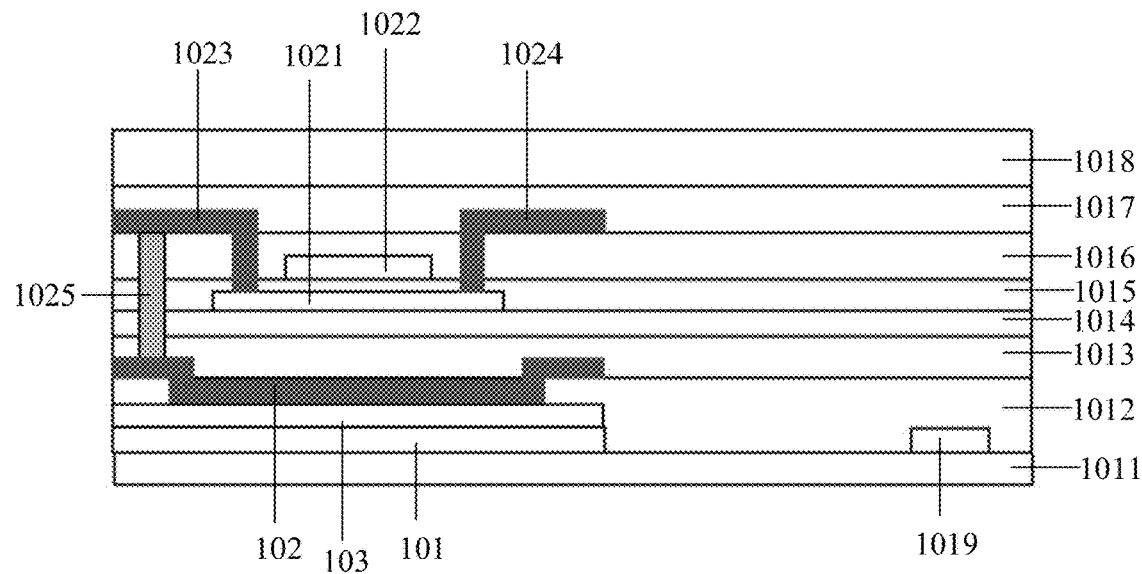
FIG. 4A is a schematic diagram of a photoelectric sensor provided by at least one embodiment of the present disclosure.

For example, FIG. 4A illustrates a schematic diagram of a substrate provided by an embodiment of the present disclosure. As illustrated in FIG. 4A, in the embodiment, the substrate includes a base substrate, a photoelectric sensor and a switching transistor; the photoelectric sensor and the switching transistor are arranged on the base substrate; and in a direction perpendicular to the base substrate 1011, the photoelectric sensor and the switching transistor are overlapped.

For example, as illustrated in FIG. 4A, the switching transistor includes structures such as an active layer 1021, a gate electrode 1022, a first source-drain electrode 1023, and a second source-drain electrode 1024; one of the first source-drain electrode 1023 and the second source-drain electrode 1024 is implemented as a source electrode, and the other one is implemented as a drain electrode.

For example, the switching transistor is arranged on a side of the photoelectric sensor away from the base substrate 1011, and the first source-drain electrode 1023 of the switching transistor is electrically connected with one of the first electrode 101 and the second electrode 102 of the photoelectric sensor.

For example, in the embodiment of FIG. 4A, the second electrode 102 of the photoelectric sensor is arranged on a side of the first electrode 101 away from the base substrate 1011, the first source-drain electrode 1023 is electrically connected with the second electrode 102, and in the direction perpendicular to the base substrate 1011, the first source-drain electrode 1023 is at least partially overlapped with the second electrode 102. In this way, the first source-drain electrode 1023 and the second electrode 102 can be electrically connected through a vertically extending connection electrode 1025.

For example, orthographic projections of the photoelectric sensor and the switching transistor on the base substrate occupy essentially the same range. In this way, the total space occupied by the photoelectric sensor and the switching transistor on the base substrate can be reduced.

Figure 4B:
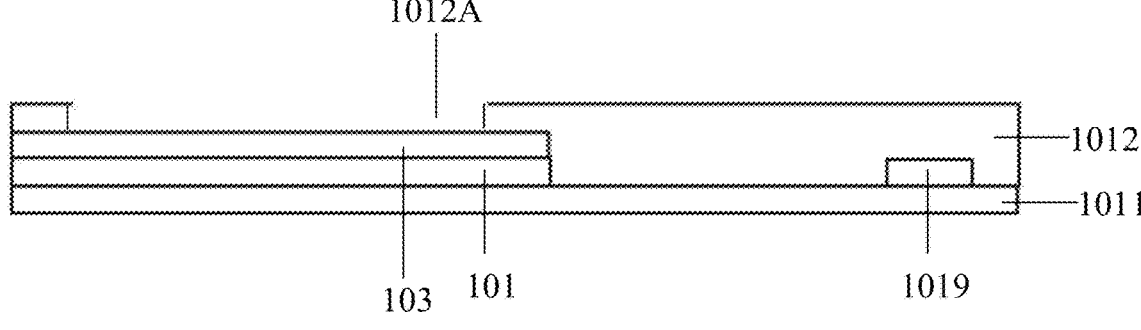
FIG. 4B to 4E are schematic diagrams of the photoelectric sensor in FIG. 4A during a manufacturing process.

For example, FIGS. 4B to 4E illustrate schematic diagrams of the substrate in FIG. 4A during the manufacturing process. In the manufacturing process, as illustrated in FIG. 4B, firstly, a first electrode material layer and a photoelectric conversion material layer are sequentially formed on a base substrate 1011, such as a glass substrate, by a process such as deposition or sputtering, for example, in the embodiment, the first electrode material layer can be an ITO layer, and the photoelectric conversion material layer can be an IGZO layer; and then the first electrode material layer and the photoelectric conversion material layer are patterned to form the first electrode 101 and the photoelectric conversion layer 103. For example, at the same time when forming the first electrode 101, a wiring line 1019 can also be formed, and the wiring line 1019 is, for example, electrically connected with the first electrode 101 for providing the first electrode 101 with an electrical signal. For example, a first planarization layer 1012 is formed on the photoelectric conversion layer 103 by a process such as coating, and the first planarization layer 1012 is patterned to form an opening 1012A exposing the photoelectric conversion layer 103.

Figure 4C:
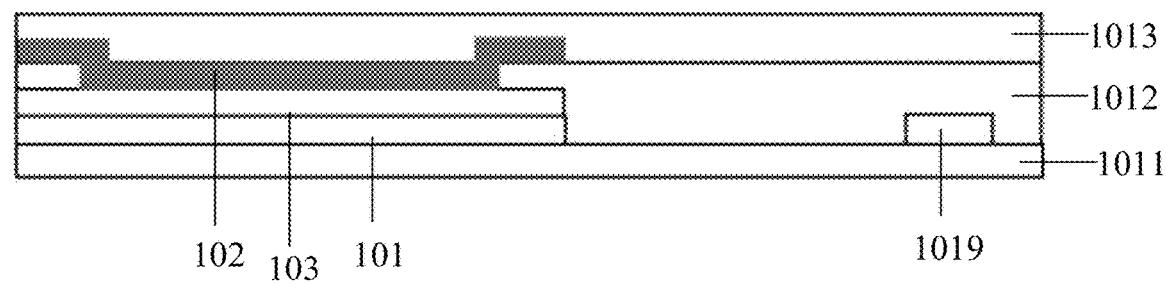

Afterwards, as illustrated in FIG. 4C, a second electrode material layer, such as a Mo layer, is formed on the first planarization layer 1012 by a process such as sputtering or deposition, then the second electrode material layer is patterned to form the second electrode 102. Afterwards, a second planarization layer 1013 is formed on the second electrode 102 by a process such as coating.

Figure 4D:
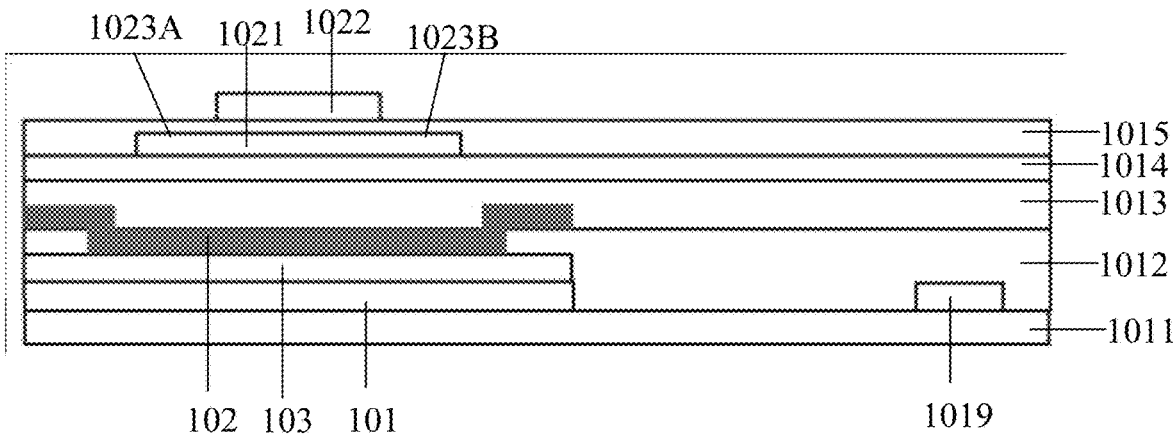

For example, as illustrated in FIG. 4D, a buffer layer 1014 is formed on the second planarization layer 1013 by a process such as deposition, then an active material layer is formed on the buffer layer 1014 by a process such as deposition, and the active material layer is patterned to form the active layer 1021. Afterwards, a gate insulating layer 1015 is formed on the active layer 1021 by a process such as deposition, a gate material layer is formed on the gate insulating layer 1015 by a process such as sputtering or deposition, and the gate material layer is patterned to form the gate electrode 102. For example, the active layer 1021 can be doped, with the gate electrode 102 as a mask, by for example P-type doping or N-type doping, so that the active layer 1021 is converted into a conductor, a first source-drain region 1023A and a second source-drain region 1023B that are conductive are formed in the active layer 1021, and an un-doped region between the first source-drain region 1023A and the second source-drain region 1023B is a channel region.

Figure 4E:
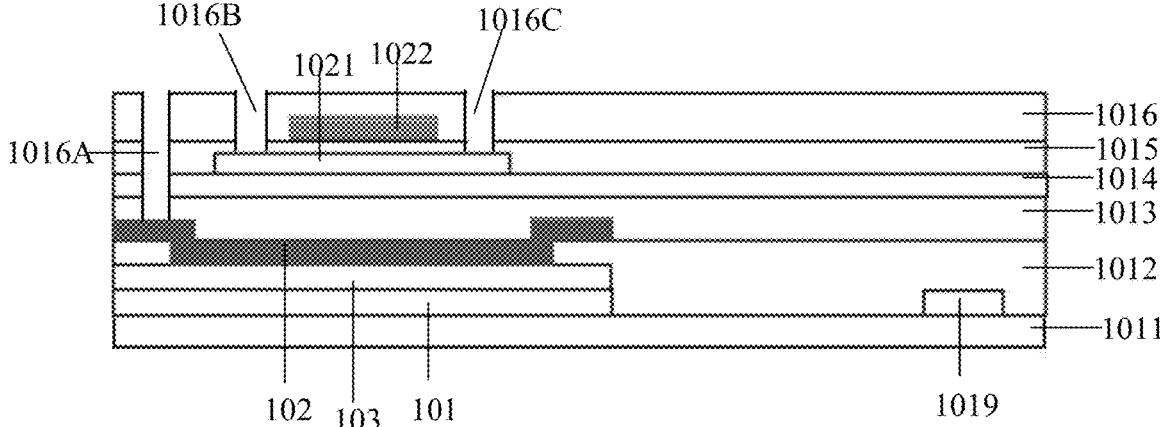

For example, as illustrated in FIG. 4E, an interlayer insulating layer 1016 is formed on the gate electrode 1022 by a process such as deposition, and the second planarization layer 1013, the buffer layer 1014, the gate insulating layer 1015 and the interlayer insulating layer 1016 are simultaneously patterned to form a first via hole 1016A exposing the second electrode 102, a second via hole 1016B exposing the first source-drain region 1023A, and a third via hole 1016C exposing the second source-drain region 1023B. Then, a source-drain material layer is formed on the interlayer insulating layer 1016 by a process such as sputtering or deposition, and the source-drain material layer is patterned to form a connection electrode 1025, a first source-drain electrode 1023 and a second source-drain electrode 1024. Subsequently, as illustrated in FIG. 4A, a passivation layer 1017 is formed on the first source-drain electrode 1023 and the second source-drain electrode 1024 by a process such as deposition, and a third planarization layer 1018 is formed on the passivation layer 1017 by a process such as coating.

For example, in the above embodiments, the first electrode 101 may be a transparent electrode with a high work function, so that signal light can enter from the bottom of the substrate. The first electrode 101 can serve as an anode electrode of the photoelectric sensor. For example, the second electrode 102 may be an opaque electrode with a light-shielding effect to block light irradiated from the bottom, so that the light is prevented from being irradiated to the active layer 1021 of the switching transistor, and the stability of the switching transistor is improved. For example, the second electrode 102 can serve as a cathode electrode of a photoelectric sensor. For example, the first planarization layer 1012 can prevent the second electrode 102 from short-circuiting with sidewalls of the first electrode 101 and the photoelectric conversion layer 103 formed below during the manufacturing process, and has a flattening effect; and the second planarization layer 1013 can shield the electrical influence of the second electrode 102 on the channel of the active layer 1021 of the switching transistor.

For example, the above-mentioned photoelectric sensor can be used in electronic substrates such as bottom emission OLED display substrates and LCD display substrates to realize functions such as optical compensation and fingerprint recognition.

For example, in other embodiments, the substrate may also adopt other structures. For example, FIG. 5A illustrates a schematic diagram of another substrate provided by an embodiment of the present disclosure. As illustrated in FIG. 5A, in the embodiment, the switching transistor is arranged on a side of the photoelectric sensor away from the base substrate 2011, and the second electrode 102 of the photoelectric sensor is arranged on a side of the first electrode 101 away from the base substrate 2011.

For example, as illustrated in FIG. 5A, the switching transistor includes an active layer 2021 arranged on a side of the second electrode 102 away from the base substrate 2011, a gate electrode 2022 arranged on a side of the active layer 2021 away from the base substrate 2011, and a first source-drain electrode 2023 and a second source-drain electrode 2024 arranged on the side of the active layer 2021 away from the base substrate 2011 and electrically connected with the active layer 2021 respectively.

For example, in the embodiment, the second electrode 102 can be reused as another gate electrode of the switching transistor. In this way, the switching transistor is formed as a dual-gate structure including the gate electrode 2022 (as the top gate electrode) and the second electrode 102 (as the bottom gate electrode); the gate electrode 2022 and the second electrode 102 jointly control the switching state of the switching transistor.

For example, as illustrated in FIG. 5A, in a direction perpendicular to the base substrate 2011, the gate electrode 2022 and the second electrode 102 are at least partially overlapped, and are at least partially overlapped with the active layer 1021. In this way, the space of the above structure occupied on the base substrate 2011 can be reduced.

For example, FIGS. 5B to 5D illustrate schematic diagrams of the substrate in FIG. 5A during the manufacturing process. During the manufacturing process, as illustrated in FIG. 5B, firstly, a first electrode material layer and a photoelectric conversion material layer are sequentially formed on the base substrate 2011, such as a glass substrate, by a process such as deposition or sputtering, then the first electrode material layer and the photoelectric conversion material layer are patterned simultaneously to form the first electrode 101 and the photoelectric conversion layer 103. For example, at the same time when forming the first electrode 101, a wiring line 2019 may also be formed; the wiring line 2019 is, for example, electrically connected with the first electrode 101 and used for providing the first electrode 101 with electrical signals. Subsequently, a first planarization layer 2012 is formed on the photoelectric conversion layer 103 by a process such as coating, and the first planarization layer 2012 is patterned to form an opening 2012A exposing the photoelectric conversion layer 103.

For example, as illustrated in FIG. 5C, a second electrode material layer is formed on the first planarization layer 2012 by a process such as sputtering or deposition, and the second electrode material layer is patterned to form the second electrode 102. Afterwards, a buffer layer 2013 is formed on the second electrode 102, and an active material layer is formed on the buffer layer 2013 by a process such as deposition, and the active material layer is patterned to form the active layer 2021.

As illustrated in FIG. 5D, a gate insulating layer 2014 is formed on the active layer 2021 by a process such as deposition, and a gate material layer is formed on the gate insulating layer 2014 by a process such as deposition or sputtering, and the gate material layer is patterned to form a gate electrode 2022. For example, the active layer 2021 is doped, with the gate electrode 2022 as a mask, so that the active layer 2021 is converted into a conductor, and a first source-drain region 2023A and a second source-drain region 2023B that are conductive are formed in the active layer 2021, and an un-doped region between the first source-drain region 2023A and the second source-drain region 2023B is a channel region.

Then, an interlayer insulating layer 2015 is formed on the gate insulating layer 2014 by a process such as deposition, the gate insulating layer 2014 and the interlayer insulating layer 2015 are patterned to form a first via hole 2015A and a second via hole 2015B respectively exposing the first source-drain region 2023A and the second source-drain region 2023B.

Then, as illustrated in FIG. 5A, a source-drain material layer is formed on the interlayer insulating layer 2015 by a process such as deposition or sputtering, and the source-drain material layer is patterned to form the first source-drain electrode 2023 and the second source-drain electrode 2024. Subsequently, a passivation layer 2015 is formed on the first source-drain electrode 2023 and the second source-drain electrode 2024 by a process such as deposition, and a second planarization layer 2016 is formed on the passivation layer 2015 by a process such as coating.

For example, in the above-mentioned substrate, the first electrode 101 can be a transparent electrode with a high work function and is used as an anode electrode of the photoelectric sensor; and the second electrode 102 may be an opaque electrode with a light-shielding effect and serve as a cathode electrode of the photoelectric sensor. For example, signal light is incident from the bottom of the substrate to cause a voltage change of the second electrode 102, so that a conversion from the single light to an electrical signal is realized according to modulation effect of the bottom gate electrode on the switching characteristics of the switching transistor. For example, the substrate can also be used in electronic substrates such as bottom emission OLED display substrates and LCD display substrates to realize functions such as optical compensation and fingerprint recognition.

For example, in some other embodiments, FIG. 6A illustrates a schematic diagram of another substrate provided by an embodiment of the present disclosure. As illustrated in FIG. 6A, in the embodiment, the photoelectric sensor is arranged on a side of the switching transistor away from the base substrate 3011, the switching transistor includes an active layer 3021, a gate electrode 3022, a first source-drain electrode 3023 and a second source-drain electrode 3024. For example, the first source-drain electrode 3023 is reused as the first electrode 101 or the second electrode 102 of the photoelectric sensor, thus the substrate structure can be simplified, the number of layers can be reduced, and materials can be saved. For example, FIG. 6A illustrates that the first source-drain electrode 3023 is reused as the second electrode 102 of the photoelectric sensor.

For example, in the direction perpendicular to the base substrate 3011, the gate electrode 3022 and the photoelectric sensor are respectively located on opposite sides or the same side of the active layer 3021. FIG. 6A illustrates that the gate electrode 3022 and the photoelectric sensor are on a same side of the active layer 3021, at this time, the switching transistor has a top gate structure.

For example, FIGS. 6B to 6D illustrate schematic diagrams of the substrate in FIG. 6A during the manufacturing process. In the manufacturing process, as illustrated in FIG. 6B, firstly, a buffer layer 3012 is formed on a base substrate 3011, such as a glass substrate, by a process such as deposition, then an active material layer is formed on the buffer layer 3012 by using a process such as deposition, and the active material layer is patterned to form the active layer 3021.

As illustrated in FIG. 6C, a gate insulating layer 3013 is formed on the active layer 3021 by a process such as deposition, and a gate material layer is formed on the gate insulating layer 3013 by a process such as sputtering or deposition, then the gate material layer is patterned to form a gate electrode 3022. For example, the active layer 3021 is doped by using the gate electrode 3022 as a mask, so that the active layer 3021 is converted into a conductor, and a first source-drain region 3021A and a second source-drain region 3021B that are conductive are formed in the active layer 3021, and an un-doped region between the first source-drain region 3021A and the second source-drain region 3021B is a channel region.

As illustrated in FIG. 6C, an interlayer insulating layer 3014 is formed on the gate electrode 3022 by a process such as deposition, and the gate insulating layer 3013 and the interlayer insulating layer 3014 are patterned to form a first via hole 3014A and a second via hole 3014B exposing the first source-drain region 3021A and the second source-drain region 3021B respectively.

As illustrated in FIG. 6D, a source-drain material layer is formed on the interlayer insulating layer 3014 by a process such as sputtering or deposition, and the source-drain material layer is patterned to form the first source-drain electrode 3023 and the second source-drain electrode 3024. Afterwards, a photoelectric conversion material layer is formed on the first source-drain electrode 3023 by a process such as deposition, and the photoelectric conversion material layer is patterned to form the photoelectric conversion layer 103.

Figure 6E:
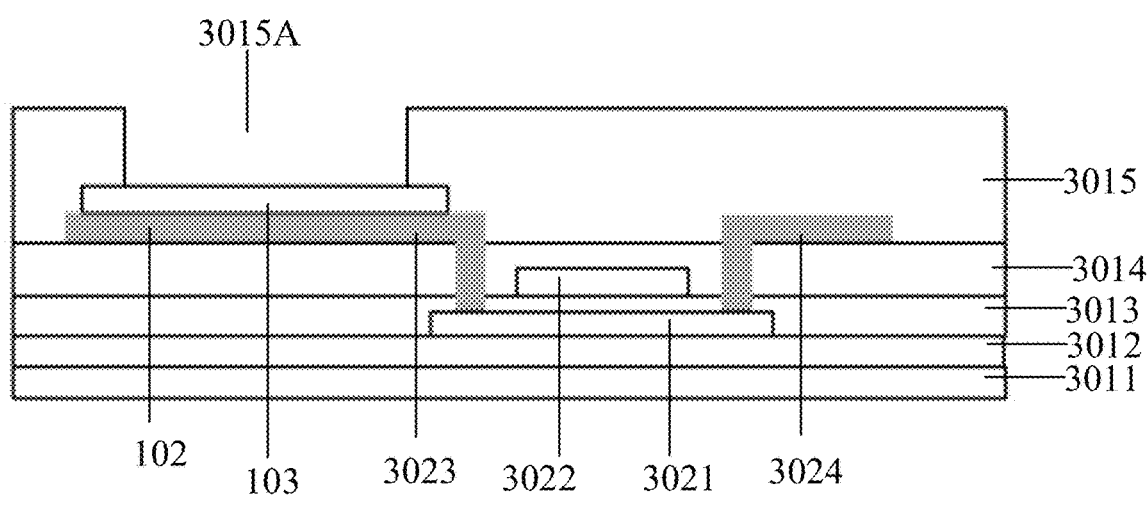

As illustrated in FIG. 6E, a first planarization layer 3015 is formed on the photoelectric conversion layer 103 by a process such as coating, and the first planarization layer 3015 is patterned to form an opening 3015A exposing the photoelectric conversion layer 103.

Then, as illustrated in FIG. 6A, a first electrode material layer is formed on the first planarization layer 3015 by a process such as sputtering or deposition, and the first electrode material layer is patterned to form the first electrode 101. Finally, a second planarization layer 3016 is formed on the first electrode 101 by a process such as coating.

For example, the first electrode 101 can be a transparent electrode with a high work function, and is used as an anode electrode of the photoelectric sensor; the first source-drain electrode of the switching transistor is reused as the second electrode 102, which may be an opaque electrode with a light-shielding effect and used as a cathode electrode of the photoelectric sensor. At this time, signal light can be incident from the top of the substrate. The substrate has a more simplified manufacturing process and is compatible with OLED and LCD display technologies; for example, the substrate can be used in electronic substrates such as OLED display substrates and LCD display substrates to realize functions such as optical compensation and fingerprint recognition.

For example, in some other embodiments, FIG. 7A illustrates a schematic diagram of another substrate provided by an embodiment of the present disclosure. As illustrated in FIG. 7A, in the embodiment, the photoelectric sensor is arranged on a side of the switching transistor away from the base substrate 4011. The switching transistor includes an active layer 4021, a gate electrode 4022, a first source-drain electrode 4023 and a second source-drain electrode 4024. For example, the first source-drain electrode 4023 is reused as the first electrode 101 or the second electrode 102 of the photoelectric sensor. FIG. 7A illustrates that the first source-drain electrode 4023 is reused as the second electrode 102 of the photoelectric sensor.

For example, in the direction perpendicular to the base substrate 4011, the gate electrode 4022 and the photoelectric sensor are respectively located on opposite sides of the active layer 4021; at this time, the switching transistor has a bottom gate structure.

For example, FIGS. 7B to 7D illustrate schematic diagrams of the substrate in FIG. 7A during the manufacturing process. In the manufacturing process, as illustrated in FIG. 7B, firstly, a gate material layer is formed on the base substrate 4011, such as a glass substrate, by a process such as sputtering or deposition, and the gate material layer is patterned to form the gate electrode 4022. Subsequently, a gate insulating layer 4012 and an active material layer are sequentially formed on the gate electrode 4022 by a process such as deposition, then the active material layer is patterned to form the active layer 4021.

As illustrated in FIG. 7C, a source-drain material layer 4020 and a photoelectric conversion material layer are sequentially formed on the active layer 4021 by a process such as sputtering or deposition, then the photoelectric conversion material layer is patterned to form the photoelectric conversion layer 103; afterwards, the source-drain material layer 4020 is patterned to form a first source-drain electrode 4023 and a second source-drain electrode 4024, as illustrated in FIG. 7D.

For example, as illustrated in FIG. 7D, a passivation layer 4013 is formed on the first source-drain electrode 4023 and the second source-drain electrode 4024 by a process such as deposition, and a first planarization layer 4014 is formed on the passivation layer 4013 by a process such as coating, then the passivation layer 4013 and the first planarization layer 4014 are patterned to form an opening 4014A exposing the photoelectric conversion layer 103.

Subsequently, a first electrode material layer is formed on the first planarization layer 4014 by a process such as sputtering or deposition, and the first electrode material layer is patterned to form the first electrode 101. Finally, a second planarization layer is formed on the first electrode 101 by a process such as coating.

For example, the first electrode 101 can be a transparent electrode with a high work function and is used as an anode electrode of the photoelectric sensor; the first source-drain electrode of the switching transistor is reused as a second electrode 102, which is an opaque electrode with a light-shielding effect. At this time, signal light can be incident from the top of the substrate. The substrate also has a more simplified manufacturing process and is compatible with OLED and LCD display technologies. For example, the substrate can be used in electronic substrates such as OLED display substrates and LCD display substrates, to realize functions such as optical compensation and fingerprint recognition.

For example, in the above-mentioned embodiments, the switching transistor has a bottom gate structure, and the first source-drain electrode 4023 and the second source-drain electrode 4024 are overlapped on the active layer 4021; in the manufacturing process of the active layer 4021, there is no need to convert the active layer 4021 into a conductor, and no low-doped region is provided in the active layer 4021, which is favorable for application in high-resolution (PPI) display products.

For example, in some other embodiments, FIG. 8A illustrates a schematic diagram of another substrate provided by an embodiment of the present disclosure. As illustrated in FIG. 8A, in the embodiment, the photoelectric sensor is arranged on a side of the switching transistor away from the base substrate 5011. The switching transistor includes an active layer 5021, a gate electrode 5022, a first source-drain electrode 5023 and a second source-drain electrode 5024. The first source-drain electrode 5023 and the second source-drain electrode 5024 are electrically connected with the active layer 5021. For example, the gate electrode 5022 is reused as the first electrode 101 or the second electrode 102 of the photoelectric sensor, and FIG. 8A illustrates that the gate electrode 5022 is reused as the second electrode 102 of the photoelectric sensor.

For example, as illustrated in FIG. 8A, the gate electrode 5022 is arranged on a side of the active layer 5021 away from the base substrate 5011, and is reused as the second electrode 102; the photoelectric conversion layer 103 is arranged on a side of the gate electrode 5022 away from the base substrate 5011; and the first electrode 101 is arranged on a side of the photoelectric conversion layer 103 away from the base substrate 5011.

For example, the first source-drain electrode 5023 and the second source-drain electrode 5024 may be arranged in the same layer as the gate electrode 5022. For example, in a direction perpendicular to the base substrate 5011, the photoelectric conversion layer 103 is at least partially overlapped with the active layer 5021.

In the embodiments of the present disclosure, "arranged in a/the same layer" means that two functional layers or structural layers are formed in a same layer of the hierarchical structure of the substrate and formed from a same material; that is, in the manufacturing process, the two functional layers or structural layers can be formed from the same material layer, and the required patterns and structures can be formed through a same patterning process, thereby simplifying the manufacturing process of the substrate.

For example, FIGS. 8B to 8G illustrate schematic diagrams of the substrate in FIG. 8A during the manufacturing process. In the manufacturing process, as illustrated in FIG. 8B, firstly, a buffer layer 5012 and an active material layer are sequentially formed on a base substrate 5011, such as a glass substrate, by a process such as deposition, and the active material layer is patterned to form the active layer 5021.

Then, as illustrated in FIG. 8C, a gate insulating layer 5013 is formed on the active layer 5021 by a process such as deposition.

Then, as illustrated in FIG. 8D, a photoresist pattern 5020 is formed over the gate insulating layer 5013, and the active layer 5021 is doped by using the photoresist pattern 5020 as a mask, so that the active layer 5021 is converted into a conductor, and a first source-drain region 5021A and a second source-drain region 5021B that are conductive are formed in the active layer 5021, and an un-doped region between the first source-drain region 5021A and the second source-drain region 5021B is a channel region. Subsequently, the photoresist pattern 5020 is removed by, for example, an ashing process.

Figure 8E:
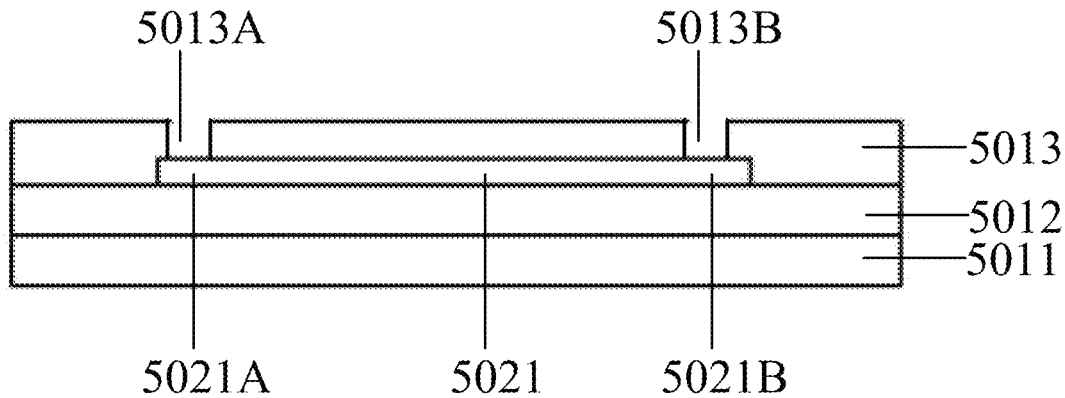

As illustrated in FIG. 8E, the gate insulating layer 5013 is patterned to form a first via hole 5013A and a second via hole 5013B respectively exposing the first source-drain region 5021A and the second source-drain region 5021B.

Figure 8F:
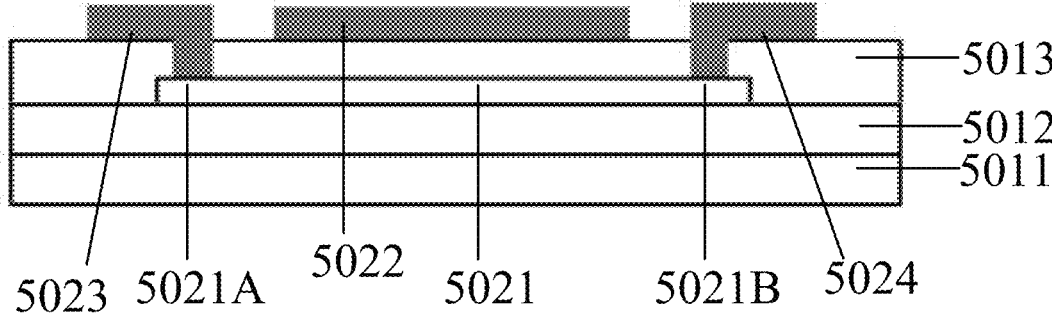

As illustrated in FIG. 8F, a source-drain material layer is formed on the gate insulating layer 5013 by a process such as sputtering or deposition, and the source-drain material layer is patterned to form the gate electrode 5022, the first source-drain electrode 5023 and the second source-drain electrode 5024 at the same time.

As illustrated in FIG. 8G, a photoelectric conversion material layer is formed on the gate electrode 5022, the first source-drain electrode 5023 and the second source-drain electrode 5024 by a process such as deposition, and the photoelectric conversion material layer is patterned to form the photoelectric conversion layer 103. Then, a passivation layer 5014 is formed on the photoelectric conversion layer 103 by a process such as deposition, and a first planarization layer 5015 is formed on the passivation layer 5014 by a process such as coating, and the passivation layer 5014 and the first planarization layer 5015 are patterned to form an opening 5015A exposing the photoelectric conversion layer 103.

Then, as illustrated in FIG. 8A, a first electrode material layer is formed on the first planarization layer 5015 by a process such as sputtering or deposition, and the first electrode material layer is patterned to form the first electrode 101. Afterwards, a second planarization layer 5016 is formed on the first electrode 101 by a process such as coating.

For example, the first electrode 101 can be a transparent electrode with a high work function, and is used as an anode electrode of the photoelectric sensor; the switching transistor has a top gate structure, and the gate electrode of the switching transistor is reused as the second electrode 102, which is an opaque electrode with light-shielding effect and used as a cathode electrode of the photoelectric sensor. At this time, signal light can be incident from the top of the substrate. The substrate has a more simplified manufacturing process and is compatible with OLED and LCD display technologies, and the substrate can be used in electronic substrates such as OLED display substrates and LCD display substrates, to realize functions such as optical compensation and fingerprint recognition.

For example, in the embodiment, the gate electrode 5022, the first source-drain electrode 5023 and the second source-drain electrode 5024 are formed by a single patterning process, and are formed into a coplanar structure. In this way, on the one hand, the process flow can be simplified, and on the other hand, a short circuit can be avoided in the case where the gate electrode 5022 is crossed with the first source-drain electrode 5023 or the second source-drain electrode 5024, thereby improving the product yield.

For example, in some other embodiments, FIG. 9A illustrates a schematic diagram of another substrate provided by an embodiment of the present disclosure. As illustrated in FIG. 9A, in the embodiment, in a direction parallel to the base substrate 6011, the photoelectric sensor and the switching transistor are arranged side by side. The switching transistor includes an active layer 6021, a gate electrode 6022, a first source-drain electrode 6023 and a second source-drain electrode 6024. For example, the first source-drain electrode 6023 is arranged in the same layer as the first electrode 101 or the second electrode 102 of the photoelectric sensor, and it is illustrated in FIG. 9A that the first source-drain electrode 6023 is arranged in the same layer as the second electrode 102 of the photoelectric sensor.

For example, in some embodiments, as illustrated in FIG. 10, the first source-drain electrode 6023 is arranged in the same layer as and integrally connected with the first electrode 101 or the second electrode 102 of the photoelectric sensor, and it is illustrated in FIG. 10 that the first source-drain electrode 6023 and the second electrode 102 of the photoelectric sensor are arranged in the same layer, and are connected integrally, so that the first source-drain electrode 6023 can directly provide an electrical signal to the second electrode 102.

For example, in the embodiment, the gate electrode 6022 is arranged in the same layer as the second electrode 102, the first source-drain electrode 6023 and the second source-drain electrode 6024. For example, the active layer 6021 is arranged in the same layer as the photoelectric conversion layer 103. In this way, the manufacturing process of the substrate can be greatly simplified, and the cost can be saved.

Figure 9B:
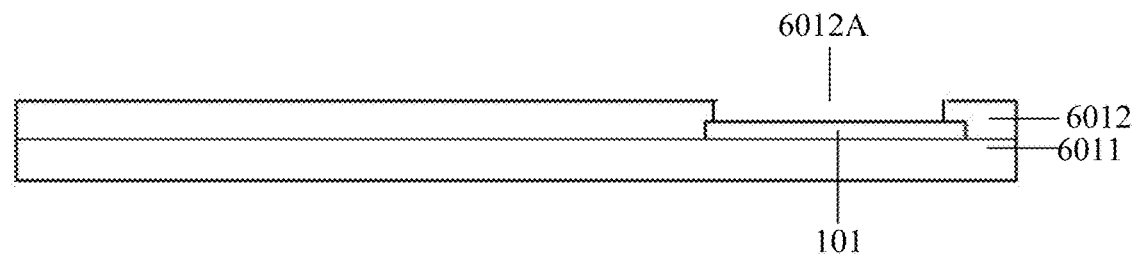

For example, FIG. 9B to FIG. 9G illustrate schematic diagrams of the substrate in FIG. 9A during the manufacturing process. In the manufacturing process, as illustrated in FIG. 9B, firstly, a first electrode material layer is formed on a base substrate 6011, such as a glass substrate, by a process such as sputtering or deposition, and the first electrode material layer is patterned to form the first electrode 101. Then, a buffer layer 6012 is formed on the first electrode 101 by a process such as deposition, and the buffer layer 6012 is patterned to form an opening 6012A exposing the first electrode 101.

Figure 9C:
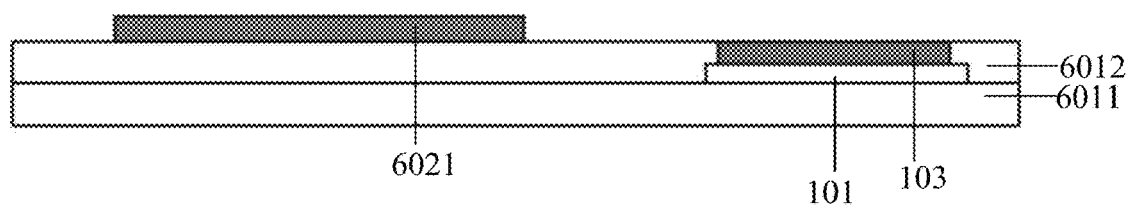

As illustrated in FIG. 9C, an active material layer is formed on the buffer layer 6012 and the first electrode 101 by a process such as deposition, and the active material layer is patterned to form the active layer 6021 and the photoelectric conversion layer 103 at the same time.

Figure 9D:
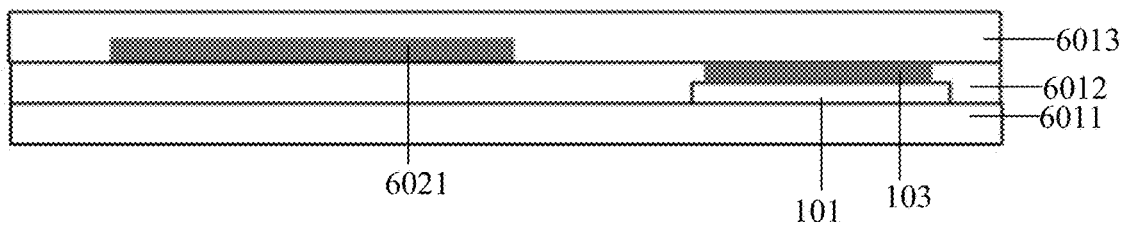
Figure 9E:
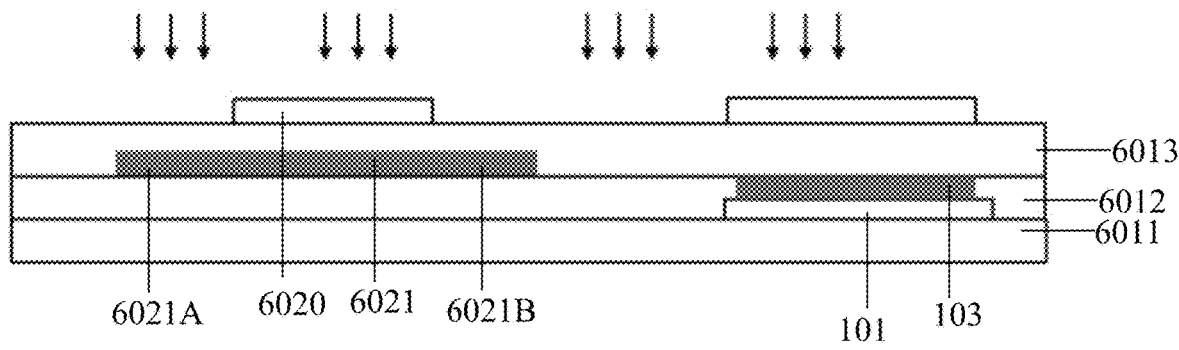

As illustrated in FIG. 9D, a gate insulating layer 6013 is formed on the active layer 6021 and the photoelectric conversion layer 103 by a process such as deposition, and a photoresist pattern 6020 is formed on the gate insulating layer 6013. As illustrated in FIG. 9E, the active layer 6021 is doped by using the photoresist pattern 6020 as a mask, so that the active layer 6021 is converted into a conductor, and a first source-drain regions 6021A and a second source-drain region 6021B that are conductive are formed in the active layer 6021, and an un-doped region between the first source-drain region 6021A and the second source-drain region 6021B is a channel region; then the photoresist pattern 6020 is removed, for example, by an ashing process.

Figure 9F:
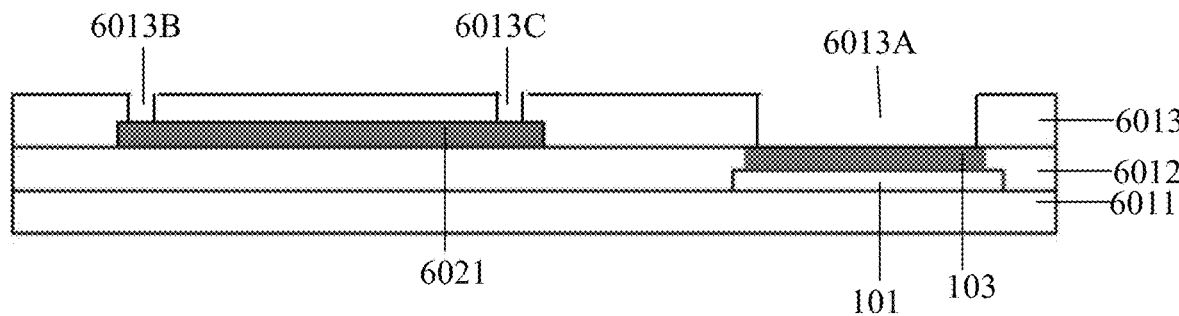

As illustrated in FIG. 9F, the gate insulating layer 6013 is patterned to form an opening 6013A exposing the photoelectric conversion layer 103, and a first via hole 6013B and a second via hole 6013C respectively exposing the first source-drain region 6021A and the second source-drain region 6021B.

Figure 9G:
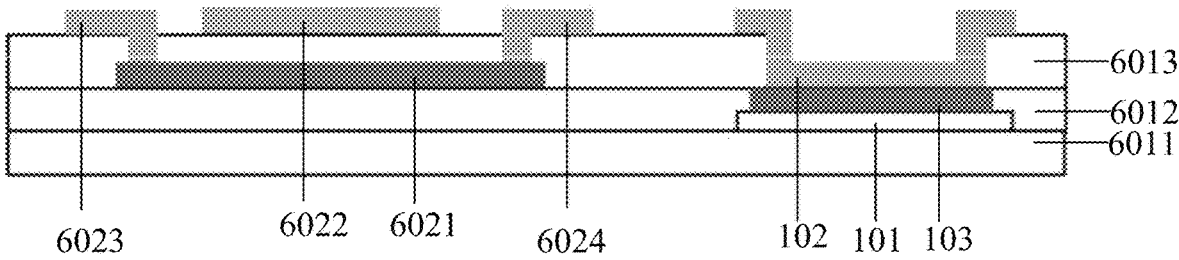

Then, as illustrated in FIG. 9G, a source-drain material layer is formed on the gate insulating layer 6013 by a process such as sputtering or deposition, and the source-drain material layer is patterned to form the gate electrode 6022, the first source-drain electrode 6023, the second source-drain electrode 6024 and the second electrode 102 at the same time.

Finally, as illustrated in FIG. 9A, a passivation layer 6014 is formed on the gate electrode 6022, the first source-drain electrode 6023, the second source-drain electrode 6024 and the second electrode 102 by a process such as deposition, and a planarization layer 6015 is formed on the passivation layer 6014 by a process such as coating.

For example, the first electrode 101 is a transparent electrode with a high work function, and is used as an anode electrode of the photoelectric sensor; the second electrode 102 is an opaque electrode with light-shielding effect, and serves as a cathode electrode of the photoelectric sensor. At this time, the signal light can be incident from the bottom of the substrate, which is suitable for bottom emission OLED display substrates, and meanwhile is compatible with LCD display technology, so as to realize functions such as optical compensation and fingerprint recognition. Moreover, the substrate has a relatively smaller thickness, which can realize a light and thin design.

For example, in various embodiments of the present disclosure, the buffer layer may adopt inorganic insulating materials such as silicon oxide, silicon nitride, or silicon oxynitride, so as to be isolated from impurities and provide a flat surface or the like. The passivation layer can also adopt inorganic insulating materials such as silicon oxide, silicon nitride or silicon oxynitride to provide functions of passivation, insulation and protection. The planarization layer can adopt organic insulating materials such as epoxy resin and polyimide to realize functions of insulation and planarization. The active layer can adopt semiconductor oxide materials, such as IGZO, ITZO or IGTO. By using the semiconductor oxide materials to form the active layer of the switching transistor, it can reduce the leakage current, so that the noise is effectively reduced and a signal-to-noise ratio is improved. For example, metal materials or alloy materials such as TiN, Mo, Pt, Pd, Ru, Ni, Cu or Ti can be used for manufacturing the gate electrode and the source-drain electrode.

The above-mentioned various substrates provided by the embodiments of the present disclosure integrate the photoelectric sensor and the switching transistor together, and both the photoelectric conversion layer of the photoelectric sensor and the active layer of the switching transistor are made of semiconductor oxide materials, so that the comprehensive performance of the photoelectric conversion layer and the switching transistor can be improved at the same time, the purposes of saving space, simplifying the process flow, and reducing the number of masks can be achieved, and the application in high-resolution (PPI) products can be realized.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

The above are only specific embodiments of the present disclosure, but the protection scope of the present disclosure is not limited thereto. The protection scope of the present disclosure should be subject to the protection scope of the claims.

What is claimed is:

1. A photoelectric sensor, comprising:
a photoelectric conversion layer,
a first electrode, arranged on a side of the photoelectric conversion layer, and
a second electrode, arranged on a side of the photoelectric conversion layer and spaced apart from the first electrode;
wherein the first electrode and the second electrode are configured to drive the photoelectric conversion layer; and in a direction perpendicular to a surface of the photoelectric conversion layer, the first electrode and the second electrode are respectively overlapped with the photoelectric conversion layer; and the photoelectric conversion layer comprises an oxide semiconductor material, and
wherein a work function of a material of at least one of the first electrode and the second electrode is greater than an electron affinity of a material of the photoelectric conversion layer by more than 0.65 eV.

2. The photoelectric sensor according to claim 1, further comprising:
a dielectric layer, arranged between the first electrode and the photoelectric conversion layer, and/or, arranged between the second electrode and the photoelectric conversion layer.

3. The photoelectric sensor according to claim 2, wherein a material of the dielectric layer comprises silicon oxide or silicon nitride.

4. The photoelectric sensor according to claim 1, further comprising:

a protective layer, arranged on a side of the photoelectric conversion layer away from the first electrode, and comprising an opening exposing the photoelectric conversion layer.

5. A substrate, comprising:

a base substrate, the photoelectric sensor according to claim 1, arranged on the base substrate; and a switching transistor, arranged on the base substrate; wherein in a direction perpendicular to the base substrate, the photoelectric sensor is overlapped with the switching transistor, or in a direction parallel to the base substrate, the photoelectric sensor and the switching transistor are arranged side by side.

6. The substrate according to claim 5, wherein the switching transistor is arranged on a side of the photoelectric sensor away from the base substrate, the switching transistor comprises a first source-drain electrode, and the first source-drain electrode is electrically connected with one of the first electrode and the second electrode of the photoelectric sensor.

7. The substrate according to claim 6, wherein the second electrode of the photoelectric sensor is arranged on a side of the first electrode away from the base substrate, the first source-drain electrode is electrically connected with the second electrode; and in the direction perpendicular to the base substrate, the first source-drain electrode is at least partially overlapped with the second electrode.

8. The substrate according to claim 5, wherein the switching transistor is arranged on the side of the photoelectric sensor away from the base substrate, the second electrode of the photoelectric sensor is arranged on a side of the first electrode away from the base substrate, the switching transistor comprises an active layer arranged on a side of the second electrode away from the base substrate and a gate electrode arranged on a side of the active layer away from the base substrate, and the second electrode is reused as another gate electrode of the switching transistor.

9. The substrate according to claim 8, wherein in the direction perpendicular to the base substrate, the gate electrode and the second electrode are at least partially overlapped.

10. The substrate according to claim 5, wherein the switching transistor comprises a first source-drain electrode, and the first source-drain electrode is reused as the first electrode or the second electrode of the photoelectric sensor.

11. The substrate according to claim 10, wherein the photoelectric sensor is arranged on a side of the switching transistor away from the base substrate, the switching transistor further comprises an active layer and a gate electrode; and in the direction perpendicular to the base substrate, the gate electrode and the photoelectric sensor are located on opposite sides of the active layer respectively or located on a same side of the active layer.

12. The substrate according to claim 5, wherein the switching transistor comprises a gate electrode, and the gate electrode is reused as the first electrode or the second electrode of the photoelectric sensor.

13. The substrate according to claim 12, wherein the photoelectric sensor is arranged on a side of the switching transistor away from the base substrate, the switching transistor comprises an active layer and the gate electrode, the gate electrode is on a side of the active layer away from the base substrate, and is reused as the second electrode, and the photoelectric conversion layer is arranged on a side of the gate electrode away from the base substrate, and the first electrode is arranged on a side of the photoelectric conversion layer away from the base substrate.

14. The substrate according to claim 13, wherein the switching transistor further comprises a first source-drain electrode and a second source-drain electrode electrically connected with the active layer, and the first source-drain electrode and the second source-drain electrode are arranged in a same layer as the gate electrode.

15. The substrate according to claim 13, wherein in the direction perpendicular to the base substrate, the photoelectric conversion layer is at least partially overlapped with the active layer.

16. The substrate according to claim 5, wherein in the case where the photoelectric sensor and the switching transistor are arranged side by side in the direction parallel to the base substrate, the switching transistor comprises a first source-drain electrode, and the first source-drain electrode is arranged in a same layer as the first electrode or the second electrode of the photoelectric sensor.

17. The substrate according to claim 16, wherein the first source-drain electrode is integrally connected with the first electrode or the second electrode of the photoelectric sensor.

18. The substrate according to claim 16, wherein the switching transistor further comprises a gate electrode, and the gate electrode is arranged in a same layer as the first source-drain electrode.

19. The substrate according to claim 16, wherein the switching transistor further comprises an active layer, and the active layer and the photoelectric conversion layer are arranged in a same layer.

\* \* \* \* \*